(12) United States Patent
Hatano et al.

(10) Patent No.: US 11,818,925 B2
(45) Date of Patent: Nov. 14, 2023

(54) LIGHT-EMITTING DEVICE, METHOD FOR MANUFACTURING THE SAME, AND CELLULAR PHONE

(71) Applicant: Semiconductor Energy Laboratory Co., Ltd., Atsugi (JP)

(72) Inventors: Kaoru Hatano, Kanagawa (JP); Satoshi Seo, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 10 days.

(21) Appl. No.: 17/562,085

(22) Filed: Dec. 27, 2021

(65) Prior Publication Data
US 2022/0123079 A1    Apr. 21, 2022

Related U.S. Application Data

(60) Continuation of application No. 16/930,373, filed on Jul. 16, 2020, now Pat. No. 11,289,558, which is a
(Continued)

(30) Foreign Application Priority Data
Nov. 18, 2008 (JP) .................. 2008-294661

(51) Int. Cl.
*H04M 1/02* (2006.01)
*H10K 59/127* (2023.01)
(Continued)

(52) U.S. Cl.
CPC ........ *H10K 59/127* (2023.02); *H04M 1/0269* (2022.02); *H10K 50/841* (2023.02);
(Continued)

(58) Field of Classification Search
CPC .. H10K 59/127; H10K 50/841; H10K 50/846; H10K 59/122; H10K 59/124;
(Continued)

(56) References Cited

U.S. PATENT DOCUMENTS 3,885,196 A    5/1975  Fischer
5,627,364 A    5/1997  Codama et al.
(Continued)

FOREIGN PATENT DOCUMENTS

CN    001319892 A    10/2001
CN    001444427 A    9/2003
(Continued)

OTHER PUBLICATIONS

Han.C et al., "3.2: Distinguished Paper: 15-inch XGA Dual-Plate OLED Display(DOD)Based on Amorphous Silicon(a-Si) TFT Backplane", SID Digest '08 : SID International Symposium Digest of Technical Papers, May 20, 2008, vol. 39, pp. 5-6.
(Continued)

*Primary Examiner* — MD K Talukder
(74) *Attorney, Agent, or Firm* — Fish & Richardson P.C.

(57) ABSTRACT

The invention relates to: a light-emitting device which includes a first flexible substrate having a first electrode, a light-emitting layer over the first electrode, and a second electrode with a projecting portion over the light-emitting layer and a second flexible substrate having a semiconductor circuit and a third electrode electrically connected to the semiconductor circuit, in which the projecting portion of the second electrode and the third electrode are electrically connected to each other; a method for manufacturing the light-emitting device; and a cellular phone which includes a housing incorporating the light-emitting device and having a longitudinal direction and a lateral direction, in which the
(Continued)

light-emitting device is disposed on a horn side and in an upper portion in the longitudinal direction of the housing.

5 Claims, 28 Drawing Sheets

Related U.S. Application Data division of application No. 15/276,071, filed on Sep. 26, 2016, now Pat. No. 10,896,941, which is a continuation of application No. 14/103,990, filed on Dec. 12, 2013, now Pat. No. 10,269,883, which is a continuation of application No. 12/617,379, filed on Nov. 12, 2009, now Pat. No. 8,610,155.

(51) Int. Cl.
- H10K 50/84 (2023.01)
- H10K 59/122 (2023.01)
- H10K 59/124 (2023.01)
- H10K 71/50 (2023.01)
- H10K 77/10 (2023.01)
- H10K 59/12 (2023.01)
- H10K 102/00 (2023.01)

(52) U.S. Cl.
CPC ......... *H10K 50/846* (2023.02); *H10K 59/122* (2023.02); *H10K 59/124* (2023.02); *H10K 59/1275* (2023.02); *H10K 71/50* (2023.02); *H10K 77/111* (2023.02); *H10K 59/1201* (2023.02); *H10K 2102/311* (2023.02); *Y02E 10/549* (2013.01); *Y02P 70/50* (2015.11)

(58) Field of Classification Search
CPC .. H10K 59/1275; H10K 71/50; H10K 77/111; H10K 59/1201; H10K 2102/311; H04M 1/0269; Y02E 10/549; Y02P 70/50
See application file for complete search history.

(56) References Cited

U.S. PATENT DOCUMENTS

| 5,684,365 | A | 11/1997 | Tang et al. |
| 5,747,928 | A | 5/1998 | Shanks et al. |
| 6,035,180 | A | 3/2000 | Kubes et al. |
| 6,125,286 | A | 9/2000 | Jahagirdar et al. |
| 6,160,540 | A | 12/2000 | Fishkin et al. |
| 6,175,345 | B1 | 1/2001 | Kuribayashi et al. |
| 6,236,444 | B1 | 5/2001 | Konuma et al. |
| 6,304,763 | B1 | 10/2001 | Jahagirdar et al. |
| 6,475,845 | B2 | 11/2002 | Kimura |
| 6,548,961 | B2 | 4/2003 | Barth et al. |
| 6,603,270 | B2 | 8/2003 | Suzuki et al. |
| 6,717,359 | B2 | 4/2004 | Kimura |
| 6,744,197 | B2 | 6/2004 | Park et al. |
| 6,762,929 | B2 | 7/2004 | Sawyer |
| 6,815,905 | B2 | 11/2004 | Suzuki et al. |
| 6,862,008 | B2 | 3/2005 | Yamazaki et al. |
| 6,873,100 | B2 | 3/2005 | Park et al. |
| 6,893,896 | B1 | 5/2005 | Wagner |
| 6,958,489 | B2 | 10/2005 | Kimura |
| 6,980,275 | B1 | 12/2005 | Konuma et al. |
| 7,012,290 | B2 | 3/2006 | Kimura |
| 7,030,551 | B2 | 4/2006 | Yamazaki et al. |
| 7,038,288 | B2 | 5/2006 | Lai et al. |
| 7,045,438 | B2 | 5/2006 | Yamazaki et al. |
| 7,057,340 | B2 | 6/2006 | Imura |
| 7,067,976 | B2 | 6/2006 | Yamazaki |
| 7,071,488 | B2 | 7/2006 | Kimura |
| 7,129,102 | B2 | 10/2006 | Yamazaki |
| 7,144,819 | B2 | 12/2006 | Sato et al. |
| 7,161,185 | B2 | 1/2007 | Yamazaki et al. |
| 7,211,944 | B2 | 5/2007 | Bae et al. |
| 7,245,331 | B2 | 7/2007 | Yamazaki et al. |
| 7,354,803 | B2 | 4/2008 | Koeda et al. |
| 7,355,338 | B2 | 4/2008 | Osame et al. |
| 7,372,110 | B2 | 5/2008 | Hatano |
| 7,372,200 | B2 | 5/2008 | Yamazaki |
| 7,400,089 | B2 | 7/2008 | Kim |
| 7,402,945 | B2 | 7/2008 | Yamazaki et al. |
| 7,402,946 | B2 | 7/2008 | Park et al. |
| 7,443,380 | B2 * | 10/2008 | Nozawa ............... G06F 1/1626 345/169 |
| 7,551,454 | B2 | 6/2009 | Wuchse et al. |
| 7,573,469 | B2 | 8/2009 | Yamazaki et al. |
| 7,674,650 | B2 | 3/2010 | Akimoto et al. |
| 7,696,688 | B2 | 4/2010 | Kim |
| 7,714,950 | B2 | 5/2010 | Yamazaki et al. |
| 7,723,721 | B2 | 5/2010 | Udagawa et al. |
| 7,745,252 | B2 | 6/2010 | Suzuki et al. |
| 7,768,291 | B2 | 8/2010 | Yanagisawa et al. |
| 7,811,147 | B2 | 10/2010 | Kim et al. |
| 7,855,379 | B2 | 12/2010 | Hayashi et al. |
| 7,883,939 | B2 | 2/2011 | Chida |
| 7,884,808 | B2 | 2/2011 | Joo |
| 7,911,455 | B2 | 3/2011 | Nishikawa et al. |
| 7,936,338 | B2 | 5/2011 | Iwase |
| 8,009,421 | B2 | 8/2011 | Misawa |
| 8,009,422 | B2 | 8/2011 | Misawa |
| 8,040,469 | B2 | 10/2011 | Nakamura et al. |
| 8,088,652 | B2 | 1/2012 | Hayashi et al. |
| 8,138,502 | B2 | 3/2012 | Nakamura et al. |
| 8,174,628 | B2 | 5/2012 | Matsushita et al. |
| 8,188,474 | B2 | 5/2012 | Hatano et al. |
| 8,222,097 | B2 | 7/2012 | Hanaoka et al. |
| 8,222,116 | B2 | 7/2012 | Jinbo et al. |
| 8,228,454 | B2 | 7/2012 | Yamazaki et al. |
| 8,371,891 | B2 | 2/2013 | Nakamura et al. |
| 8,383,193 | B2 | 2/2013 | Tanaka |
| 8,436,349 | B2 | 5/2013 | Sano et al. |
| 8,508,682 | B2 | 8/2013 | Yamazaki et al. |
| 8,576,555 | B2 | 11/2013 | Misawa |
| 8,749,492 | B2 | 6/2014 | Kotera et al. |
| 8,808,477 | B2 | 8/2014 | Iwase |
| 8,823,023 | B2 | 9/2014 | Jinbo et al. |
| 9,082,679 | B2 | 7/2015 | Jinbo et al. |
| 9,105,594 | B2 | 8/2015 | Yamazaki et al. |
| 9,436,036 | B2 | 9/2016 | Jinbo et al. |
| 9,625,947 | B2 | 4/2017 | Lee et al. |
| 9,647,052 | B2 | 5/2017 | Youn et al. |
| 9,972,670 | B2 | 5/2018 | Yamazaki et al. |
| 10,269,883 | B2 | 4/2019 | Hatano et al. |
| 2002/0086711 | A1 | 7/2002 | Flannery |
| 2003/0027369 | A1 | 2/2003 | Yamazaki |
| 2003/0034497 | A1 | 2/2003 | Yamazaki et al. |
| 2003/0057422 | A1 | 3/2003 | Yamazaki et al. |
| 2003/0134488 | A1 | 7/2003 | Yamazaki et al. |
| 2003/0136966 | A1 * | 7/2003 | Inoue ................. H10K 59/1275 257/79 |
| 2003/0168969 | A1 | 9/2003 | Tanabe |
| 2003/0173567 | A1 | 9/2003 | Kokubo et al. |
| 2003/0201974 | A1 | 10/2003 | Yin |
| 2003/0227441 | A1 | 12/2003 | Hioki et al. |
| 2004/0207322 | A1 | 10/2004 | Okuyama et al. |
| 2004/0227459 | A1 | 11/2004 | Imura |
| 2004/0227886 | A1 | 11/2004 | Kimura |
| 2005/0042796 | A1 | 2/2005 | Wagner |
| 2005/0110402 | A1 | 5/2005 | Tanaka |
| 2005/0110702 | A1 | 5/2005 | Aoki et al. |
| 2005/0116631 | A1 * | 6/2005 | Kim ................... H01L 27/1248 313/506 |
| 2005/0122036 | A1 | 6/2005 | Park et al. |
| 2005/0127371 | A1 | 6/2005 | Yamazaki et al. |
| 2005/0161675 | A1 | 7/2005 | Kimura |
| 2005/0161754 | A1 | 7/2005 | Izumi |
| 2005/0194894 | A1 * | 9/2005 | Sato ...................... H10K 50/84 313/504 |
| 2005/0199876 | A1 * | 9/2005 | Matsumoto ......... H01L 27/1214 257/64 |
| 2005/0287846 | A1 * | 12/2005 | Dozen ................... H01L 27/13 257/E27.113 |
| 2006/0027817 | A1 | 2/2006 | Yamazaki et al. |

(56) References Cited

U.S. PATENT DOCUMENTS

| | | |
|---|---|---|
| 2006/0119260 A1 | 6/2006 | Kim |
| 2006/0132461 A1 | 6/2006 | Furukawa et al. |
| 2006/0138942 A1 | 6/2006 | Bang et al. |
| 2006/0197116 A1 | 9/2006 | Kimura |
| 2006/0202197 A1 | 9/2006 | Nakayama et al. |
| 2006/0231858 A1* | 10/2006 | Akimoto ............ H01L 27/124 438/149 |
| 2006/0255719 A1 | 11/2006 | Oikawa et al. |
| 2007/0001927 A1 | 1/2007 | Ricks et al. |
| 2007/0004513 A1 | 1/2007 | Wells et al. |
| 2007/0029554 A1 | 2/2007 | Nakamura et al. |
| 2007/0108454 A1 | 5/2007 | Yamazaki et al. |
| 2007/0132374 A1 | 6/2007 | Park |
| 2007/0158649 A1 | 7/2007 | Lee |
| 2007/0247439 A1* | 10/2007 | Daniel ................ G06F 1/1607 345/173 |
| 2007/0295973 A1 | 12/2007 | Jinbo et al. |
| 2008/0001940 A1 | 1/2008 | Koh et al. |
| 2008/0008905 A1 | 1/2008 | Yamazaki |
| 2008/0042135 A1* | 2/2008 | Ryu ................ G02F 1/136227 438/155 |
| 2008/0079697 A1 | 4/2008 | Lee et al. |
| 2008/0083830 A1* | 4/2008 | Tokunaga ............ H01L 27/13 257/E27.113 |
| 2008/0132033 A1 | 6/2008 | Eguchi et al. |
| 2008/0151355 A1 | 6/2008 | Suwabe et al. |
| 2008/0174731 A1 | 7/2008 | Kang et al. |
| 2008/0185588 A1 | 8/2008 | Park et al. |
| 2008/0186662 A1 | 8/2008 | Lee |
| 2008/0246704 A1 | 10/2008 | Kawase |
| 2009/0047859 A1* | 2/2009 | Kim ................ G02F 1/133305 445/24 |
| 2009/0061551 A1 | 3/2009 | Yamazaki et al. |
| 2009/0085831 A1* | 4/2009 | Odoi ................ G02F 1/133524 345/1.3 |
| 2009/0149224 A1 | 6/2009 | Yamazaki et al. |
| 2009/0160796 A1 | 6/2009 | Jiang et al. |
| 2009/0184090 A1 | 7/2009 | Wuchse et al. |
| 2009/0230384 A1 | 9/2009 | Meng et al. |
| 2009/0289877 A1 | 11/2009 | Kwon et al. |
| 2010/0026167 A1 | 2/2010 | Park et al. |
| 2010/0065845 A1* | 3/2010 | Nakayama .......... H01L 29/7869 257/E29.296 |
| 2010/0123160 A1* | 5/2010 | Hatano ................ H10K 71/50 257/E33.001 |
| 2010/0151762 A1 | 6/2010 | Ikeda et al. |
| 2010/0187979 A1 | 7/2010 | Shim et al. |
| 2010/0224868 A1 | 9/2010 | Udagawa et al. |
| 2010/0248403 A1 | 9/2010 | Hatano et al. |
| 2010/0259166 A1 | 10/2010 | Cok |
| 2010/0264816 A1 | 10/2010 | Cok |
| 2010/0277443 A1 | 11/2010 | Yamazaki et al. |
| 2010/0320469 A1 | 12/2010 | Park |
| 2011/0102721 A1 | 5/2011 | Enomoto |
| 2011/0175101 A1 | 7/2011 | Hatano et al. |
| 2011/0204361 A1* | 8/2011 | Nishiki ............ H01L 27/1266 257/E33.056 |
| 2011/0227822 A1 | 9/2011 | Shai |
| 2012/0001045 A1 | 1/2012 | Wang |
| 2012/0168776 A1 | 7/2012 | Nakamura et al. |
| 2012/0224323 A1 | 9/2012 | Yang |
| 2012/0256896 A1* | 10/2012 | Yamazaki ................ G09G 5/18 455/566 |
| 2013/0001382 A1 | 1/2013 | Jang |
| 2013/0069381 A1 | 3/2013 | Sakamoto |
| 2013/0265257 A1 | 10/2013 | Jung et al. |
| 2013/0265262 A1 | 10/2013 | Jung et al. |
| 2013/0306948 A1 | 11/2013 | Yamazaki et al. |
| 2014/0028597 A1 | 1/2014 | Cho et al. |
| 2014/0049463 A1 | 2/2014 | Seo et al. |
| 2014/0099999 A1 | 4/2014 | Hatano et al. |
| 2014/0113687 A1* | 4/2014 | Sakata ............ H01L 21/02592 455/566 |
| 2014/0232686 A1 | 8/2014 | Kotera et al. |
| 2014/0285738 A1 | 9/2014 | Iwase |
| 2014/0299740 A1 | 10/2014 | Peng et al. |
| 2014/0319303 A1 | 10/2014 | Kuan et al. |
| 2015/0028328 A1 | 1/2015 | Ikeda et al. |
| 2015/0085211 A1 | 3/2015 | Iwase |
| 2015/0155505 A1* | 6/2015 | Yamazaki ............ H10K 71/421 257/40 |
| 2015/0334211 A1 | 11/2015 | Shin et al. |
| 2016/0126463 A1 | 5/2016 | Kadoma et al. |
| 2016/0308139 A1 | 10/2016 | Seo et al. |
| 2017/0012091 A1 | 1/2017 | Hatano et al. |
| 2017/0163959 A1 | 6/2017 | Wu |
| 2017/0172267 A1 | 6/2017 | Bong |
| 2019/0165069 A1 | 5/2019 | Hatano et al. |
| 2020/0350381 A1* | 11/2020 | Hatano ................ H10K 77/111 |

FOREIGN PATENT DOCUMENTS

| | | |
|---|---|---|
| EP | 1139454 A | 10/2001 |
| EP | 1146565 A | 10/2001 |
| EP | 1220515 A | 7/2002 |
| EP | 1310997 A | 5/2003 |
| EP | 1343206 A | 9/2003 |
| EP | 1667245 A | 6/2006 |
| EP | 1760798 A | 3/2007 |
| EP | 1858042 A | 11/2007 |
| EP | 1860531 A | 11/2007 |
| EP | 1970886 A | 9/2008 |
| EP | 2919226 A | 9/2015 |
| JP | 06-037697 A | 2/1994 |
| JP | 08-111516 A | 4/1996 |
| JP | 08-234683 A | 9/1996 |
| JP | 08-293620 A | 11/1996 |
| JP | 11-017579 A | 1/1999 |
| JP | 2001-296814 A | 10/2001 |
| JP | 2001-519585 | 10/2001 |
| JP | 2001-337623 A | 12/2001 |
| JP | 2002-214351 A | 7/2002 |
| JP | 2002-247170 A | 8/2002 |
| JP | 2002-297066 A | 10/2002 |
| JP | 2002-341792 A | 11/2002 |
| JP | 2003-058075 A | 2/2003 |
| JP | 2003-086359 A | 3/2003 |
| JP | 2003-208110 A | 7/2003 |
| JP | 2003-255850 A | 9/2003 |
| JP | 2003-258211 A | 9/2003 |
| JP | 2003-280552 A | 10/2003 |
| JP | 2003-337541 A | 11/2003 |
| JP | 2003-345286 A | 12/2003 |
| JP | 2004-004811 A | 1/2004 |
| JP | 2004-006343 A | 1/2004 |
| JP | 2004-145878 A | 5/2004 |
| JP | 2004-281085 A | 10/2004 |
| JP | 2004-327215 A | 11/2004 |
| JP | 2005-037930 A | 2/2005 |
| JP | 2005-080608 A | 3/2005 |
| JP | 2005-099410 A | 4/2005 |
| JP | 2005-114916 A | 4/2005 |
| JP | 2005-338179 A | 12/2005 |
| JP | 2006-005712 A | 1/2006 |
| JP | 2006-098617 A | 4/2006 |
| JP | 2006-108077 A | 4/2006 |
| JP | 2006-164972 A | 6/2006 |
| JP | 2007-067381 A | 3/2007 |
| JP | 2007-505484 | 3/2007 |
| JP | 2007-096277 A | 4/2007 |
| JP | 2007-264005 A | 10/2007 |
| JP | 2007-266593 A | 10/2007 |
| JP | 2007-316847 A | 12/2007 |
| JP | 2007-326259 A | 12/2007 |
| JP | 2008-009246 A | 1/2008 |
| JP | 2008-046279 A | 2/2008 |
| JP | 2008-052073 A | 3/2008 |
| JP | 2008-089884 A | 4/2008 |
| JP | 2008-157996 A | 7/2008 |
| JP | 2008-158723 A | 7/2008 |
| JP | 2008-159935 A | 7/2008 |
| JP | 2008-210770 A | 9/2008 |
| JP | 2008-216529 A | 9/2008 |

(56) References Cited

FOREIGN PATENT DOCUMENTS

| | | |
|---|---|---|
| JP | 2008-233779 A | 10/2008 |
| JP | 2008-235871 A | 10/2008 |
| WO | WO-1999/018590 | 4/1999 |
| WO | WO-2004/064018 | 7/2004 |
| WO | WO-2005/025282 | 3/2005 |
| WO | WO-2006/095684 | 9/2006 |
| WO | WO-2007/077649 | 7/2007 |
| WO | WO-2008/105347 | 9/2008 |

OTHER PUBLICATIONS

European Search Report (Application No. 09176012.4) dated Jun. 28, 2013.

\* cited by examiner

FIG. 13A
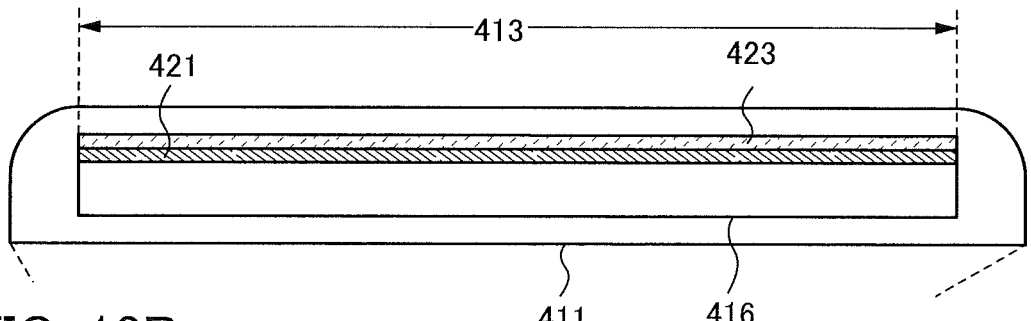
FIG. 13B
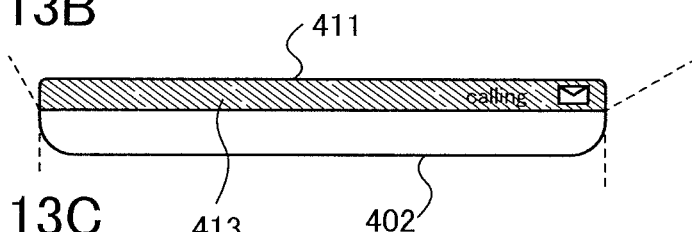
FIG. 13C
FIG. 13D
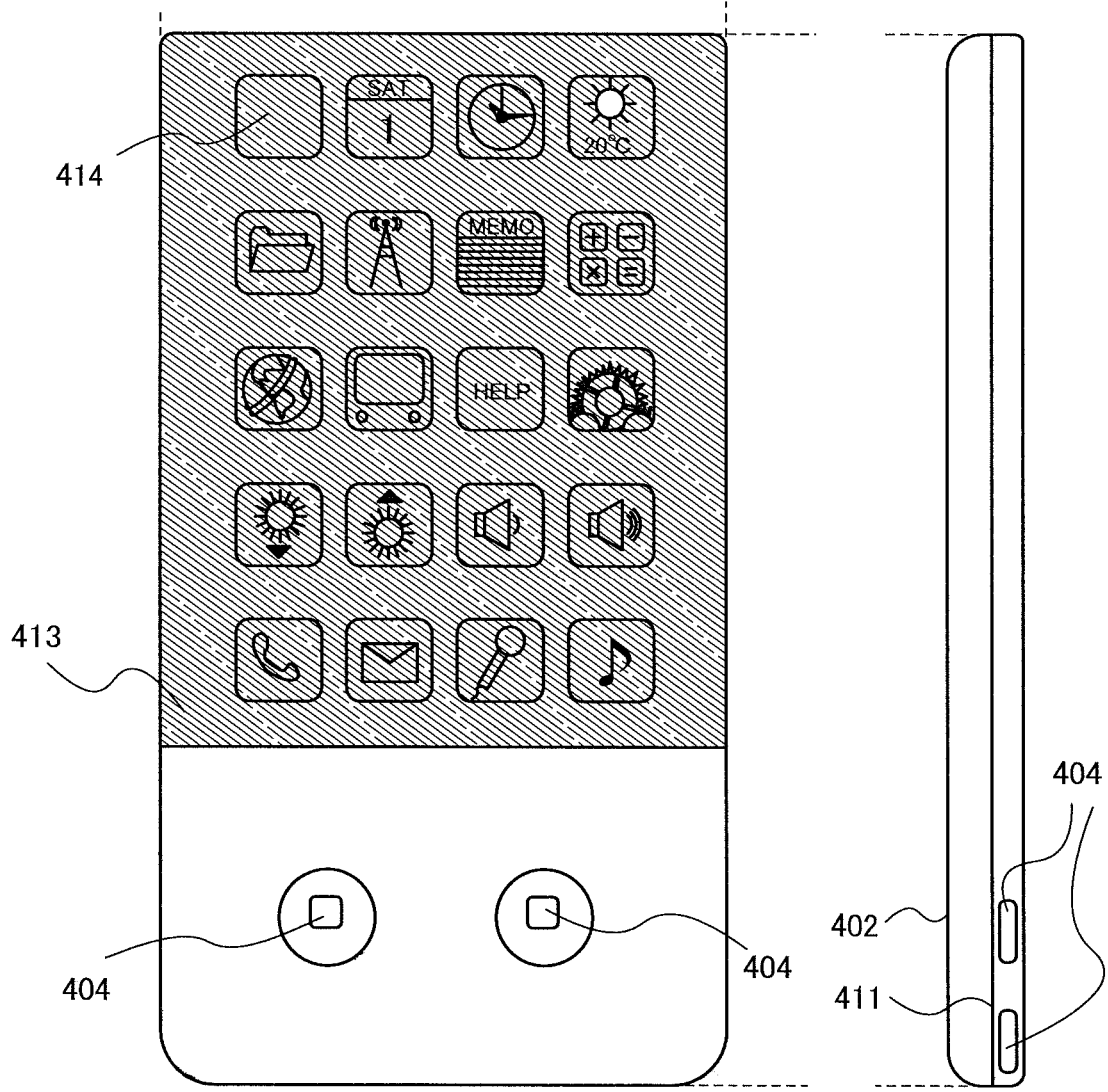

331
332

LIGHT-EMITTING DEVICE, METHOD FOR MANUFACTURING THE SAME, AND CELLULAR PHONE

CROSS-REFERENCE TO RELATED APPLICATIONS

This application is a continuation of U.S. application Ser. No. 16/930,373, filed Jul. 16, 2020, now allowed, which is a divisional of U.S. application Ser. No. 15/276,071, filed Sep. 26, 2016, now U.S. Pat. No. 10,896,941, which is a continuation of U.S. application Ser. No. 14/103,990, filed Dec. 12, 2013, now U.S. Pat. No. 10,269,883, which is a continuation of U.S. application Ser. No. 12/617,379, filed Nov. 12, 2009, now U.S. Pat. No. 8,610,155, which claims the benefit of a foreign priority application filed in japan as Serial No. 2008-294661 on Nov. 18, 2008, all of which are incorporated by reference.

BACKGROUND OF THE INVENTION

1. Field of the Invention

The invention disclosed in this specification relates to a light-emitting device, a method for manufacturing the light-emitting device, and a cellular phone.

2. Description of the Related Art

Conventionally, a light-emitting device having a light-emitting element has been formed through the following steps of: 1) forming a semiconductor circuit for driving a light-emitting element over a substrate such as a glass substrate by using a semiconductor process, 2) forming an insulating film (a planarization film) over the semiconductor circuit, and 3) forming a light-emitting element over the insulating film. In other words, a semiconductor circuit for driving a light-emitting element and the light-emitting element are formed by being stacked over a substrate in this order.

Since a light-emitting device manufactured through the conventional manufacturing process has a light-emitting element over a semiconductor circuit for driving the light-emitting element, there is a step (irregularity) or the like resulting from an element, a wiring, or the like that is formed below the light-emitting element (see Reference 1).

[Reference 1] Japanese Published Patent Application No. 2003-258211

SUMMARY OF THE INVENTION

As mentioned above, one of problems is that defective coverage may be caused by a step or the like resulting from an element, a wiring, or the like that is formed below a light-emitting element.

Other problems that occur when a semiconductor circuit for driving a light-emitting element is formed and then the light-emitting element is formed thereover are long manufacturing time and high manufacturing cost.

Another problem is that a light-emitting layer in a light-emitting element is sensitive to moisture, so that the entry of moisture into a light-emitting element should be prevented.

In addition, a problem that occurs when a light-emitting element and a semiconductor circuit for driving the light-emitting element are formed over a hard substrate such as a glass substrate is that the light-emitting element and the semiconductor circuit cannot be incorporated into electronic devices of various shapes because such a hard substrate lacks flexibility and the shape cannot be changed.

A problem that occurs when a light-emitting element and a semiconductor circuit for driving the light-emitting element are formed over a flexible substrate is that although the shape of the substrate can be freely changed, stress may damage the light-emitting element and the semiconductor circuit for driving the light-emitting element.

In view of the above problems, in accordance with the invention disclosed in this specification, a semiconductor circuit for driving a light-emitting element and the light-emitting element are disposed over flexible substrates and attached to each other such that the light-emitting element and the semiconductor circuit for driving the light-emitting element are electrically connected to each other. The light-emitting element and the semiconductor circuit for driving the light-emitting element may be formed over different substrates and separated from the respective substrates, and then may be disposed over respective flexible substrates and attached to each other.

Because the light-emitting element and the semiconductor circuit for driving the light-emitting element are disposed over different substrates, the semiconductor circuit is not formed below the light-emitting element.

In addition, a projecting portion is formed in part of the light-emitting element, and the light-emitting element and the semiconductor circuit for driving the light-emitting element are attached to each other such that a space portion is provided therebetween. A desiccant can be disposed in the space portion.

Because the light-emitting element and the semiconductor circuit for driving the light-emitting element can be disposed over flexible substrates, the shape can be changed even after the light-emitting element and the semiconductor circuit are attached to each other.

Furthermore, the light-emitting element and the semiconductor circuit for driving the light-emitting element are disposed over flexible substrates such that a space (a space portion) for relaxing stress is provided between the light-emitting element and the semiconductor circuit for driving the light-emitting element.

The invention disclosed in this specification relates to a light-emitting device which includes a first flexible substrate having a first electrode, a light-emitting layer over the first electrode, and a second electrode with a projecting portion over the light-emitting layer and a second flexible substrate having a semiconductor circuit and a third electrode electrically connected to the semiconductor circuit. The projecting portion of the second electrode and the third electrode are electrically connected to each other.

The invention relates to a light-emitting device in which a desiccant is provided in a space portion that is generated by disposing the first flexible substrate and the second flexible substrate to face each other.

The invention disclosed in this specification also relates to a light-emitting device which includes a first flexible substrate having a first electrode, a light-emitting layer over the first electrode, and a second electrode with a projecting portion over the light-emitting layer and a second flexible substrate having a semiconductor circuit and a third electrode electrically connected to the semiconductor circuit. The projecting portion of the second electrode and the third electrode are electrically connected to each other through an anisotropic conductive film that contains conductive particles.

The invention relates to a light-emitting device which includes a structure body covering the semiconductor circuit and having a fibrous body and an organic resin, and the third electrode penetrating the structure body and formed with a conductive resin.

The invention relates to a method for manufacturing a light-emitting device, which includes the steps of: forming a first separation layer, a first insulating film (a base film), a first electrode, a light-emitting layer, and a second electrode with a projecting portion over a first substrate; separating the first insulating film, the first electrode, the light-emitting layer, and the second electrode from the first substrate by using the first separation layer; forming a first adhesive layer over a first flexible substrate; attaching the first insulating film, the first electrode, the light-emitting layer, and the second electrode to the first flexible substrate with the first adhesive layer; forming a second separation layer, a second insulating film, a semiconductor circuit, and a third electrode electrically connected to the semiconductor circuit over a second substrate; separating the second insulating film, the semiconductor circuit, and the third electrode from the second substrate by using the second separation layer; forming a second adhesive layer over a second flexible substrate; attaching the second insulating film, the semiconductor circuit, and the third electrode to the second flexible substrate with the second adhesive layer; and electrically connecting the projecting portion of the second electrode and the third electrode to each other.

The invention relates to a method for manufacturing a light-emitting device in which a desiccant is provided in a space portion that is generated by disposing the first flexible substrate and the second flexible substrate to face each other.

The invention disclosed in this specification also relates to a method for manufacturing a light-emitting device, which includes the steps of: forming a first separation layer, a first insulating film (a base film), a first electrode, a light-emitting layer, and a second electrode with a projecting portion over a first substrate; separating the first insulating film, the first electrode, the light-emitting layer, and the second electrode from the first substrate by using the first separation layer; forming a first adhesive layer over a first flexible substrate; attaching the first insulating film, the first electrode, the light-emitting layer, and the second electrode to the first flexible substrate with the first adhesive layer; forming a second separation layer, a second insulating film, a semiconductor circuit, and a third electrode electrically connected to the semiconductor circuit over a second substrate; separating the second insulating film, the semiconductor circuit, and the third electrode from the second substrate by using the second separation layer; forming a second adhesive layer over a second flexible substrate; attaching the second insulating film, the semiconductor circuit, and the third electrode to the second flexible substrate with the second adhesive layer; forming an anisotropic conductive film containing conductive particles between the first flexible substrate and the second flexible substrate; and electrically connecting the projecting portion of the second electrode and the third electrode to each other through the anisotropic conductive film.

The invention relates to a method for manufacturing a light-emitting device, which includes the step of forming a structure body having a fibrous body and an organic resin to cover the semiconductor circuit, and the third electrode is formed with a conductive resin to penetrate the structure body.

The invention disclosed in this specification also relates to a cellular phone which includes a light-emitting device including a first flexible substrate having a first electrode, a light-emitting layer over the first electrode, and a second electrode with a projecting portion over the light-emitting layer and a second flexible substrate having a semiconductor circuit and a third electrode electrically connected to the semiconductor circuit and a housing incorporating the light-emitting device and having a longitudinal direction and a lateral direction. In the light-emitting device, the projecting portion of the second electrode and the third electrode are electrically connected to each other. The light-emitting device is disposed on a front side and in an upper portion in the longitudinal direction of the housing.

Accordingly, the semiconductor circuit is not formed below the light-emitting element and thus the generation of defective coverage due to steps can be suppressed.

In addition, because a desiccant can be disposed in the space portion between the light-emitting element and the semiconductor circuit for driving the light-emitting element, the entry of moisture into the light-emitting layer can be prevented.

In addition, because the light-emitting element and the semiconductor circuit for driving the light-emitting element can be disposed over flexible substrates, the shape can be changed even after the light-emitting element and the semiconductor circuit are attached to each other, and the light-emitting element and the semiconductor circuit for driving the light-emitting element can be incorporated into electronic devices of various shapes.

Furthermore, because a space (a space portion) is provided between the light-emitting element and the semiconductor circuit for driving the light-emitting element which are disposed over flexible substrates, stress can be relaxed even when the flexible substrates are bent.

BRIEF DESCRIPTION OF THE DRAWINGS

FIGS. 13A to 13D are top views and a cross-sectional view of a cellular phone.

DETAILED DESCRIPTION OF THE INVENTION

Figure 1:
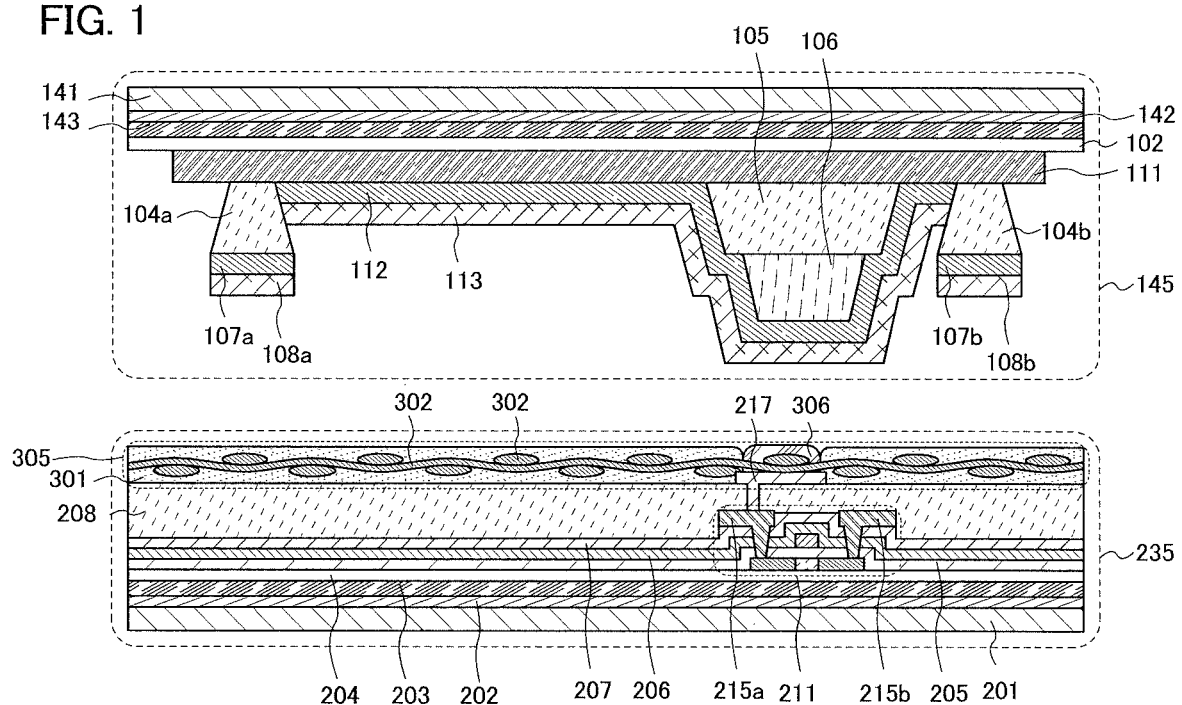
FIG. 1 is a cross-sectional view illustrating a manufacturing process of a light-emitting device.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the invention disclosed in this specification should not be interpreted as being limited to the description in the embodiments. Note that in the accompanying drawings, the same portions or portions having similar functions are denoted by the same reference numerals, and repetitive description thereof is omitted.

Note that in this specification, a semiconductor circuit refers to a circuit which functions by utilizing a semiconductor. Furthermore, a semiconductor device refers to an element or a device in general which functions by utilizing a semiconductor. Electric devices including electronic circuits, liquid crystal display devices, light-emitting devices, and the like and electronic devices on which the electric devices are mounted are included in the category of semiconductor devices.

Note that ordinal numbers such as "first" and "second" in this specification are used simply for convenience and do not restrict the order of stacked layers, the order of manufacturing steps, and the like.

Embodiment 1

In this embodiment, a light-emitting device and a method for manufacturing the light-emitting device are described with reference to FIG. 1, FIGS. 2A to 2C, FIGS. 3A and 3B, FIGS. 4A and 4B, FIGS. 5A and 5B, FIGS. 6A to 6C, FIGS. 7A to 7D, FIGS. 8A to 8C, FIGS. 9A to 9C, FIGS. 10A and 10B, FIG. 11, FIG. 12, FIGS. 14A and 14B, FIG. 15, FIG. 16, FIGS. 17A and 17B, FIGS. 18A and 18B, FIG. 19, FIG. 20, and FIG. 21.

First, a light-emitting element and a method for manufacturing the light-emitting element are described with reference to FIGS. 2A to 2C, FIGS. 3A and 3B, FIGS. 4A and 4B, FIGS. 5A and 5B, and FIGS. 6A to 6C.

Figure 2A:
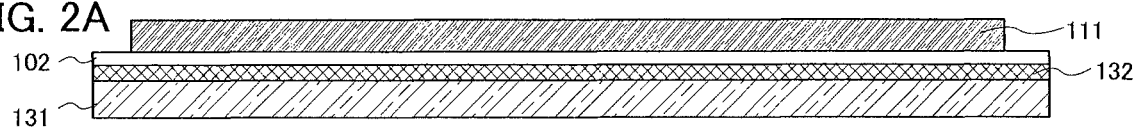
FIGS. 2A to 2C are cross-sectional views illustrating a manufacturing process of a light-emitting element.

First, a separation layer 132, a base film 102, and an electrode 111 are formed over a substrate 131 (see FIG. 2A). As the substrate 131, a glass substrate, a quartz substrate, a semiconductor substrate, a ceramic substrate, or the like may be used.

The base film 102 may be a silicon oxide film, a silicon nitride film, a silicon oxide film containing nitrogen, or a silicon nitride film containing oxygen or may be a stacked layer of any two or more of these films. The base film 102 functions to prevent the entry of moisture into a light-emitting-layer 112 which is to be formed later.

As the separation layer 132, a single layer or a stacked layer is formed using an element selected from tungsten (W), molybdenum (Mo), titanium (To, tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si) or an alloy material or a compound material mainly containing any of the elements, by a plasma CVD method, a sputtering method, or the like. The crystalline structure of a layer containing silicon may be any one of amorphous, microcrystalline, and polycrystalline structures.

When the separation layer 132 has a single-layer structure, it is preferable to form a layer containing any one of the following: tungsten, molybdenum, a mixture of tungsten and molybdenum, an oxide of tungsten, an oxynitride of tungsten, a nitride oxide of tungsten, an oxide of molybdenum, an oxynitride of molybdenum, a nitride oxide of molybdenum, an oxide of a mixture of tungsten and molybdenum, an oxynitride of a mixture of tungsten and molybdenum, and a nitride oxide of a mixture of tungsten and molybdenum. Note that a mixture of tungsten and molybdenum corresponds to an alloy of tungsten and molybdenum, for example.

When the separation layer 132 has a stacked structure, it is preferable to form a layer containing tungsten, molybdenum, or a mixture of tungsten and molybdenum as a first layer and to form a layer containing an oxide of tungsten, an oxide of molybdenum, an oxide of a mixture of tungsten and molybdenum, an oxynitride of tungsten, an oxynitride of molybdenum, or an oxynitride of a mixture of tungsten and molybdenum as a second layer. In this manner, when the separation layer 132 is formed to have a stacked structure, a stacked structure of a metal film and a metal oxide film is preferable. Examples of a method for forming a metal oxide film include a method of forming a metal oxide film directly by a sputtering method, a method of forming a metal oxide film by oxidizing a surface of a metal film formed over the substrate 131 by heat treatment or by plasma treatment in an oxygen atmosphere, and the like.

As the metal film, a film can be formed using an element selected from titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium Or), as well as tungsten (W) and molybdenum (Mo) as mentioned above, or an alloy material or a compound material mainly containing any of the elements.

Note that an insulating film such as a silicon oxide film, a silicon nitride film, a silicon oxide film containing nitrogen, or a silicon nitride film containing oxygen may be formed over the substrate 131 before the separation layer 132 is formed, and the separation layer 132 may be formed over the insulating film. By such an insulating film provided between the substrate 131 and the separation layer 132, an impurity contained, in the substrate 131 can be prevented from entering an upper layer. In addition, in a subsequent laser irradiation step, the substrate 131 can be prevented from being etched. Note that a silicon oxide film containing nitrogen is distinguished from a silicon nitride film containing oxygen in that the former contains more oxygen than nitrogen, whereas the latter contains more nitrogen than oxygen.

The electrode 111 may be formed using a conductive film having a light-transmitting property. The conductive film having a light-transmitting property can be formed by a sputtering method, a vacuum evaporation method, or the like using a material such as indium oxide ($In_2O_3$) or an alloy of indium oxide and tin oxide ($In_2O_3$—$SnO_2$) (indium tin oxide (ITO)). Alternatively, an alloy of indium oxide and zinc oxide ($In_2O_3$—ZnO) may be used. Furthermore, zinc oxide (ZnO) is also a suitable material, and moreover, zinc oxide to which gallium (Ga) is added (ZnO:Ga) in order to increase conductivity or visible light transmissivity may be used. When the 111 is formed using such a material, the electrode 111 serves as an anode.

When the electrode 111 is used as a cathode, an extremely thin film of a material with a low work function, such as aluminum, can be used. Alternatively, a stacked structure of a thin film of such a material and the above-mentioned conductive film having a light-transmitting property can be employed.

Figure 2B:
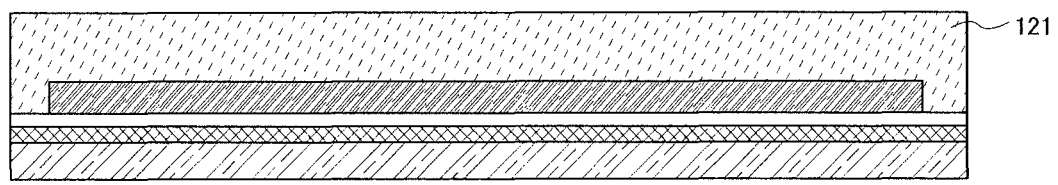

Next, an insulating film 121 is formed to cover the base film 102 and the electrode 111 (see FIG. 2B). The insulating film 121 can be formed using an inorganic or an organic material.

As an inorganic material, for example, silicon oxide, silicon nitride, silicon oxide containing nitrogen, or diamond-like carbon (DLC) or a stacked structure of two or more of these materials can be used. As an organic material, polyimide, acrylic, polyamide, polyimide amide, resist, benzocyclobutene, or siloxane or a stacked structure of two or more of these materials may be used.

Siloxane has a skeleton formed by the bond of silicon (Si) and oxygen (O), and is formed using as a starting material a polymer material including at least hydrogen or at least one of fluorine, an alkyl group, and aromatic hydrocarbon as a substituent. As the substituent, a fluoro group may be used, or both an organic group containing at least hydrogen and a fluoro group may be used as the substituents.

Figure 2C:
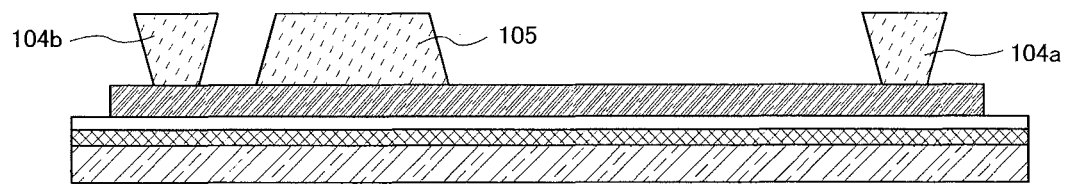

Next, using the insulating film 121, a spacer 105, a partition 104a, and a partition 104b are formed (see FIG. 2C). At this time, the spacer 105 is formed into a forward tapered shape; in other words, the spacer 105 is formed such that its cross-sectional shape is a trapezoid whose upper base is shorter than the lower base. The partition 104a and the partition 104b are each formed into an inverted tapered shape; in other words, the partition 104a and the partition 104b are each formed such that its cross-sectional shape is a trapezoid whose upper base is longer than the lower base.

The cross-sectional shape of the spacer 105 may be a trapezoid whose four corners have a curvature radius, in order to improve the coverage of the spacer 105 with a light-emitting layer 112 and an electrode 113 which are to be formed later.

The partition 104a and the partition 104b each function to separate the light-emitting layer 112 and the electrode 113, which are to be formed later, of each pixel from those of other pixels.

Note that without forming the insulating film 121, the spacer 105, the partition 104a, and the partition 104b may be formed into their respective shapes from the beginning, using an insulator. For example, the partition 104a and the partition 104b may be formed into an inverted tapered shape from the beginning, by an inkjet method or the like.

Figure 3A:
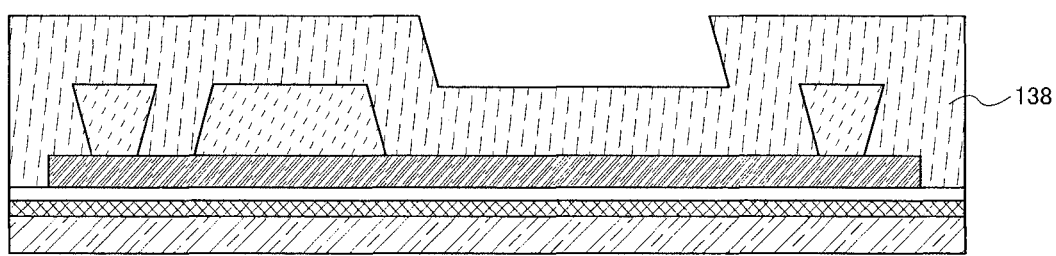
FIGS. 3A and 3B are cross-sectional views illustrating a manufacturing process of a light-emitting element.

Next, an insulating film 138 is formed using any of the materials mentioned in the description of the insulating film 121 to cover the base film 102, the electrode 111, the spacer 105, the partition 104a, and the partition 104b (see FIG. 3A). Alternatively, the insulating film 138 may be formed using a material different from that of the insulating film 121.

Figure 3B:
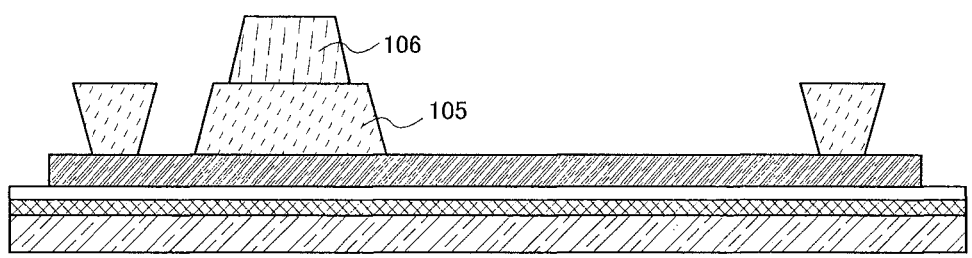

Using the insulating film 138, a spacer 106 is formed over the spacer 105 (see FIG. 3B). The spacer 106 is formed into a forward tapered shape; in other words, the spacer 106 is formed such that its cross-sectional shape is a trapezoid whose upper base is shorter than file lower base.

Note that without forming the insulating film 138, the spacer 106 may be formed into that shape from the beginning, using an insulator. For example, the spacer 106 may be formed into a forward tapered shape from the beginning by an inkjet method or the like.

The cross-sectional shape of the spacer 106 may be a trapezoid whose four corners have a curvature radius, in order to improve the coverage of the spacer 106 with the light-emitting layer 112 and the electrode 113 which are to be formed later.

When the spacer 105 and the spacer 106 are provided, the light-emitting layer 112 and the electrode 113 which are formed later are raised along the spacer 105 and the spacer 106. In other words, a projecting portion is generated in the light-emitting layer 112 and the electrode 113, and the projecting portion of the electrode 113 is to be electrically connected to a conductive resin 306 which is electrically connected to a TFT 211 as described below. The projecting portion of the electrode 113 and the conductive resin 306 are connected to each other at a position apart from the electrode 113, the light-emitting layer 112, and the TFT 211; accordingly, damage to the electrode 113, the light-emitting layer 112, and the TFT 211 can be prevented.

Figure 4A:
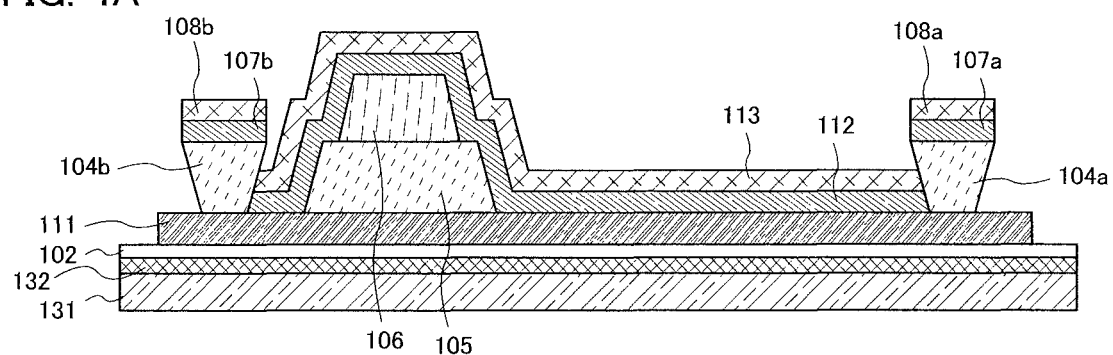
FIGS. 4A and 4B are cross-sectional views illustrating a manufacturing process of a light-emitting element.

Next, the light-emitting layer 112 and the electrode 113 are formed in a region over the electrode 111, which is surrounded by the partition 104a and the partition 104b (see FIG. 4A). Note that an EL material layer 107a that is formed from the same material as the light-emitting layer 112 and a conductive material layer 108a that is formed from the same material as the electrode 113 are formed over the partition 104a, and an EL material layer 107b that is formed from the same material as the light-emitting layer 112 and a conductive material layer 108b that is formed from the same material as the electrode 113 are formed over the partition 104b. However, these layers are each electrically insulated from the electrode 111 by the partition 104a and the partition 104b that are formed from an insulating film; thus, these layers do not emit light.

The light-emitting layer 112 may be a single layer or may be freely combined with a layer for injection, transport, or recombination of carriers of both electrons and holes, in other words, a carrier transport layer, a carrier injection layer, or the like, between the light-emitting layer and the electrode 111 or between the light-emitting layer and the electrode 113. The light-emitting layer 112 collectively refers to a light-emitting layer alone or a layer having a stacked structure of a light-emitting layer and a carrier transport layer, a carrier injection layer, or the like.

Specific materials used for a hole injection layer, a hole transport layer, a light-emitting layer, an electron transport layer, and an electron injection layer are hereinafter described.

The hole injection layer is a layer that is provided in contact with an anode, either the electrode 111 or the electrode 113, and contains a material with an excellent hole injection property. Molybdenum oxide, vanadium oxide, ruthenium oxide, tungsten oxide, manganese oxide, or the like can be used. Alternatively, the hole injection layer can be formed using any of the following materials: phthalocyanine compounds such as phthalocyanine (abbreviation: $H_2Pc$) and copper phthalocyanine (CuPc); compounds aromatic amine such as 4,4'-bis[N-(4-diphenylaminophenyl)-N-phenylamino]biphenyl (abbreviation: DPAB) and 4,4'-bis(N-{4-[N-(3-methyphenyl)-N-phenylamino]phenyl}-N-phenylamino)biphenyl (abbreviation: DNTPD); high molecular compounds such as poly(3,4-ethylenedioxythophene)/poly(styrenesulfonic acid) (abbreviation: PEDOT/PSS); and the like.

Alternatively, as the hole injection layer, a composite material of a material with an excellent hole transport property which contains an acceptor material can be used. Note that, by using a material with an excellent hole transport property which contains an acceptor material, a material used to form an electrode may be selected regardless of its work function. In other words, besides a material with a high work function, a material with a low work function may be used for the anode. As the acceptor material, 7,7,8,8-tetracyano-2,3,5,6-tetrafluoroquinodimethane (abbreviation: $F_4$-TCNQ) chloranil, or the like can be used. In addition, a transition metal oxide can be used. Moreover, an oxide of any of the metals belonging to Groups 4 to 8 of the periodic table can be used. Specifically, vanadium oxide, niobium oxide, tantalum oxide, chromium oxide, molybdenum oxide, tungsten oxide, manganese oxide, and rhenium oxide are preferable because they have excellent electron accepting properties. Among them, molybdenum oxide is especially preferable because it is stable in the air and its hygroscopic property is low so that it can be easily handled.

As the material with an excellent hole transport property which is used for the composite material, various compounds such as an aromatic amine compound, a carbazole derivative, aromatic hydrocarbon, and a high molecular compound (such as oligomer, dendrimer or polymer) can be used. Note that an organic compound used for the composite material preferably has an excellent hole transport property. Specifically, a material having a hole mobility of $10^{-6}$ $cm^2/Vs$ or higher is preferable. However, materials other than these materials can also be used, as long as they have more excellent hole transport properties than electron transport properties. Specific organic compounds which can be used for the composite material are given below.

For example, the aromatic amine compound is N,N'-di(p-tolyl)-N, N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N-(3-methylphenyl)-N-phenyylamino]phenyl}-N-phenylamino)biphenyl (abbreviation: DNTP), 1,3,5-tris[N-(4-diphenylaminophenyl)-N-phenylamino]benzene (abbreviation: DPA3B), or the like.

The carbazole derivative which can be used for the composite material is specifically 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), or the like.

The carbazole derivative which can be used for the composite material is alternatively 4,4'-di(N-carbazolyl)biphenyl (abbreviation: CBP), 1,3,5-tris[4-(N-carbazol)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, or the like.

The aromatic hydrocarbon which can be used for the composite material is, for example, 2-tert-butyl-9,10-di(2-naphthyl)anthracene (abbreviation, t-BuDNA), 2-tert-butyl-9,10-di(1-naphthyl)(anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation DMNA) 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl,
anthracene, tetracene, rubrene, perylene, 2,5,8,11-tetra(tert-butyl)perylene, or the like. Alternatively, pentacene coronene, or the like may be used. In this manner, aromatic hydrocarbon having a hole mobility of $1 \times 10^{-6}$ $cm^2/Vs$ or higher and 14 to 42 carbon atoms is preferably used.

Note that the aromatic hydrocarbon which can be used for the composite material may have a vinyl skeleton. The aromatic hydrocarbon having a vinyl group is, for example, 4,4'-bis(2,2-diphenylvinyl)biphenyl (abbreviation: DPVBi), 9,10-bis[4-(2,2-diphenylyinyl)phenyl]anthracene (abbreviation: DPVPA), or the like.

Moreover, a high molecular compound such as poly(N-vinylcarbazole) (abbreviation: PVK), poly(4-vinyltriphenylamine) (abbreviation: PVTAPA), poly[N-(4-{N'-[4-(4-diphenylamino)phenyl]phenyl-N'-phenylamino}phenyl) methacryla mide] (abbreviation: PTPDMA), or poly[N,N'-bis(4-butylphenyl)-N,N'-bis(phenyl)benzidine] (abbreviation: poly-TPD) can be used.

The hole transport layer is a layer that contains a material with an excellent hole transport property. The material with an excellent hole transport property is, for example, an aromatic amine compound such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), or 4,4'-bis[N-(spiro-9,9'-bifluoren-2-yl)-N-phenylamino]biphenyl (abbreviation: BSPB). The materials mentioned here are mainly materials having a hole mobility of $10^{-6}$ $cm^2/Vs$ or higher. However, materials other than these materials can also be used, as long as they have more excellent hole transport properties than electron transport properties. Note that the layer that contains a material with an excellent hole transport property is not limited to a single layer, and two or more layers containing any of the aforementioned materials may be stacked.

Further, a high molecular compound such as poly(N-vinylcarbazole) (abbreviation: PVK) or poly(4-vinyltriphenylamine) (abbreviation: PVTPA) can also be used for the hole transport layer.

The light-emitting layer is a layer that contains a light-emitting material. The light-emitting layer may be either a so-called light-emitting layer of a single film including an emission center material as its main component or a so-called light-emitting layer of a host-guest type in which an emission center material is dispersed in a host material.

There is no limitation on an emission center material used, and a known material that emits fluorescence or phosphorescence can be used. A fluorescent light-emitting mater is, for example, N,N'-bis[4-(9H-carbazol-9-yl)phenyl]-N-N'- diphenylstilbene-4,4'-diamine (abbreviation: YGA2S), 4-(9H-carbazol-9-yl)-4'-(10-phenyl-9-anthryl)triphenylamine (abbreviation: YGAPA), or another material an emission wavelength of 450 nm or more, such as 4-(9H-carbazol-9-yl)-4'-(9, 10-diphenyl-2-anthryl)triphenylamine (abbreviation: 2YGAPPA), N,9-diphenyl-N[4-(10-phenyl-9-anthryl)phenyl]-9H-carbazol-3-amine (abbreviation: PCAPA) perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N', N'-triphenyl-1,4-phen ylenediamine] (abbreviation: DPABPA), N,9-diphenyl-N-[4-(9,10-diphenyl-2-anthryl)phenyl]9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N''N''', N''''-octaphenyldibenzo[g,p]chrysene-2,7,10,15-tetramine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis (1,1'-biphenyl-2-yl)-2-anthryl]-N,N',N'-triphenyl-1,4-phenylenediamine (abbreviation: 2DPABPbA), 9,10-bis(1,1-biphenyl-2-yl)-N-[4-(9H-carbazol-9-yl)phenyl]-N-phenylanthracen-2-amin e (abbreviation: 2YGABPhA), N,N9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinit rile (abbreviation: DCM1), 2-{2-methyl-6-[2-(2,3,6,7-tetrahydro-1H,5H-benzo[ij]quinolizin-9-yl)ethenyl]-4H-pyra n-4-ylidene}propanedinitrile (abbreviation: DCM2), N,N,N',N'-tetrakis(4-methylphenyl)tetracene-5,11-diamine (abbreviation: p-mPhTD), 7,13-diphenyl-N,N,N', N'-tetrakis(4-methylphenyl)acenaphtho[1,2-α]fluoranthene-3,10-d iamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DC JTB), 2-(2,6-bis{2-[4-(dimethylamino)phenyl]ethenyl}-4H-pyran-4-ylidene)propanedinitrile (abbreviation: BisDCM), or 2-{2, 6-bis[2-(8-methoxy-1,1,7,7-tetramethyl-2,3,6,7-tetrahydro-1H,5H-benzo[ij]quinoli zin-9-yl)ethenyl]-4H-pyran-4-ylidene}propanedinitrile (abbreviation: BisDCJTM). A phosphorescent light-emitting material is, for example, bis[2-(4',6'-difluorophenyl)pyridinato-N,$C^{2'}$]iridium(III) tetrakis(1-pyrazolyl)borate (abbreviation: Flr6) or another material having an emission wavelength of 470 nm to 500 nm, such as bis[2-(4',6'-difluorophenyl)pyridinato-N,$C^{2'}$]iridium (III) picolinate (abbreviation: FIrpic), bis[2-(3',5',-bistrifluoromethylphenyl)pyridinato-N,$C^{2'}$]iridium(III) picolinate (abbreviation: Ir(CF$_3$ppy)$_2$(pic)), or bis[2-(4',6'-difluorophenyl)pyndinato-N,$C^{2'}$]iridium(III) acetylacetonate (abbreviation: Flracac), or another material having an emission wavelength of 500 nm (green light emission) or more, such as tris(2-phenylpyridinato)iridium(III) (abbreviation: Ir(ppy)$_3$), bis(2-phenylpyridinato)iridium(III) acetylacetonate (abbreviation Ir(ppy)$_2$(acac)), tris(acetylacetonato)(monophenanthroline)terbium(III) (abbreviation: Tb(acac)$_3$ (Phen)), bis(benzo[h]quinolinato)iridium(III) acetylacetonate (abbreviation: Ir(bzq)$_2$(acac)), bis(2,4-diphenyl-1,3-oxazolato-N,$C^{2'}$)iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,$C^{2'}$)iridium(III) acetylacetonate (abbreviation: Ir(bt)$_2$ (acac)), bis[2-(2'-benzo[4,5α]thienyl)pyridinato-N,$C^{3'}$] iridium(III) acetylacetonate (abbreviation: Ir(btp)$_2$(acac)) bis(1-phenylisoquinolinato-N,$C^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis (2,3,5-triphenylpyrazinato)iridium(III) (abbreviation(tppr)$_2$(acac)), (2,3,7,8,12,13,17,18-octaethyl-21H,23H-porphine)platinum (II) (abbreviation: PtOEP, tris (1,3-diphenyl-1,3-propanedionato)(monophenanthroline)europium(III)(abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)). The light-emitting material can be selected from the above-mentioned materials or other known materials in consideration of emission color of each light-emitting element.

In the case of using a host material, the host material is, for example, a metal complex such as tris(8-quinolinolato) aluminum(III) (abbreviation Alq), tris(4-methyl-8-quinolato)aluminum(III) (abbreviation: Almq$_3$), bis(10(hydroxybenzo[h]quinolinato)beryllium(II) (abbreviation: BAlq), bis (2-methyl-8-quinolinolato)(4-phenylphotolato)aluminum (III) (abbreviation: bis(8-quinolinolato)zinc(II) (abbreviation: Znq), bis[2-(2-benzoxnzolyl)phenolato]zinc (II) (abbreviation: ZnPBO), or bis[2(2-bezothiazolyl)phenolato]zinc(II) (abbreviation: ZnBTZ), a heterocyclic compound such as 2-(4-biphenylyl)-5-(4-tert-butylphenyl)-1,3, 4-oxadiazole (abbreviation: PBD), 1,3-bis [5-(p-tert-butylphenyl)-1,3,4-oxadiazol-2-yl]benzene (abbreviation: OXD-7) 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H -benzimidazole) (abbreviation: TPBI), bathophenanthroline (abbreviation: BPhen), bathocuproine (abbreviation: BCP), or 9-[4-(5-phenyl-1,3,4-oxadiazol-2-yl)phenyl]-9H-carbazole (abbreviation: CO11), or an aromatic amine compound such as NPB (or α-NPD), TPD, or BSPB. Alternatively a condensed polycyclic aromatic compound such as an anthracene derivative, a phenanthrene derivative, a pyrene derivative, a chrysene derivative, or a dibenzo[g,p]chrysene derivative can be used. Specifically, 9,10-diphenylanthracene (abbreviation: DPAnth), N,N-diphenyl-9-[4-(10-phenyl-9-anthryl)phenyl]-9H-carbazol-3-amine (abbreviation: CzAIPA), 4-(10-phenyl-9-anthryl)triphenylamine (abbreviation: DPhPA) 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10- bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation t-BuDNA), 9,9'-bianthryl (abbreviation: BANT), 9,9'-(stilbene-3,3'-diyl)diphenanthrene (abbreviation DPNS), 9,9'-(stilbene-4,4'-diyl)diphenanthrene (abbreviation: DPNS2), 3,3',3"-(benzene-1,3,5-triyl)tripyrene (abbreviation: TPB3), or the like can be used. From these materials or other known materials, a material may be selected which has a larger energy gap (or a triplet energy if the material emits phosphorescence) than an emission center material dispersed in the material and which has a transport property as needed.

The electron transport layer is a layer that contains a material with an excellent electron transport property. For example, the electron transport layer is a layer including a metal complex or the like having a quinoline or benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP) or the like can also be used. The materials mentioned here are mainly materials having an electron mobility of $10^{-6}$ cm$^2$/Vs or higher. Note that the electron transport layer may be formed using materials other than those mentioned above as long as the materials have more excellent electron transport properties than hole transport properties.

Furthermore, the electron transport layer is not limited to a single layer, and two or more layers which are each formed from the aforementioned material may be stacked.

In addition, a layer for controlling the movement of electron carriers may be provided between the electron transport layer and the light-emitting layer. The layer for controlling the movement of electron carriers is a layer formed by adding a small amount of material with an excellent electron trap property to a material with an excellent electron transport property as mentioned above, and carrier balance can be adjusted by controlling the movement of electron carriers. Such a structure has a great effect on reducing problems (for example, a reduction in element lifetime) which may be caused by electrons passing through the light-emitting layer.

Furthermore, the electron injection layer may be provided in contact with a cathode, the other of the electrode 111 and the electrode 113. The electron injection layer may be formed using an alkali metal, an alkaline earth metal, or a compound thereof, such as lithium fluoride (LiF), cesium fluoride (CsF), or calcium fluoride (CaF$_2$). For example, a layer formed from a material with an electron transport property, which contains an alkali metal, an alkaline earth metal, or a compound thereof, (for example, a layer that contains magnesium (Mg) in Alq), can be used. Note that the electron injection layer is preferably a layer formed from a material with an electron transport property, which contains an alkali metal or an alkaline earth metal, because electrons can be efficiently injected from the cathode.

When the electrode 113 is used as a cathode, a metal, an alloy, an electrically conductive compound, a mixture thereof, or the like with a low work function (specifically, 3.8 eV or less) can be used. Specific examples of such a cathode material are as follows: an element that belongs to Group 1 or Group 2 of the periodic table, i.e., an alkali metal such as lithium (Li) or cesium (Cs), an alkaline earth metal such as magnesium (Mg), calcium (Ca), or strontium (Sr), an alloy containing these (such as MgAg or AlLi), a rare earth metal such as europium (Eu) or ytterbium (Yb), an alloy containing these, and the like. Note that when an electron injection layer is provided between the cathode and the electron transport layer, the cathode can be formed using any of a variety of conductive materials such as Al, Ag, ITO, or indium oxide-tin oxide containing silicon or silicon oxide, regardless of its work function. Films of these conductive materials can be formed by a sputtering method, an inkjet method, a spin coating method, or the like.

When the electrode 113 is used as an anode, a metal, an alloy, a conductive compound, a mixture thereof, or the like with a high work function (specifically, 4.0 eV or more) is preferably used. Specific examples are as follows: indium tin oxide (ITO), indium tin oxide containing silicon or silicon oxide, indium zinc oxide (IZO), indium oxide containing tungsten oxide and zinc oxide, and the like. Films of these conductive metal oxides are usually formed by sputtering; however, a sol-gel method or the like may also be used. For example, a film of indium zinc oxide (IZO) can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Furthermore, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used. By providing any of the above-mentioned composite materials in contact with the anode, an electrode material can be selected regardless of its work function.

Figure 4B:
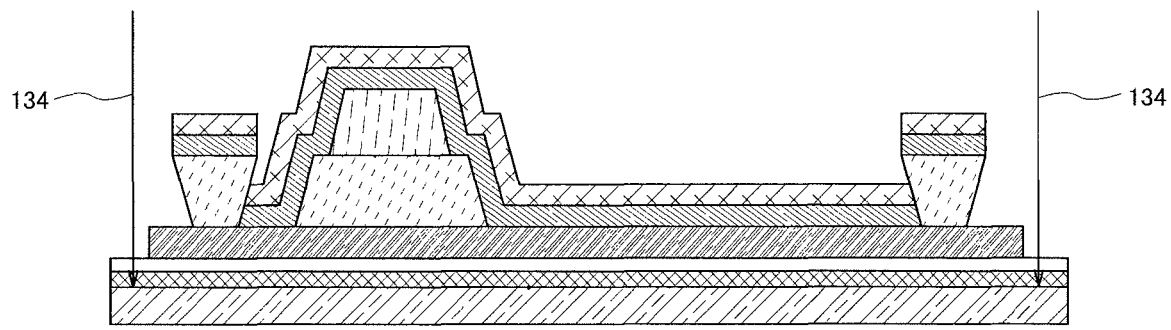
Figure 5A:
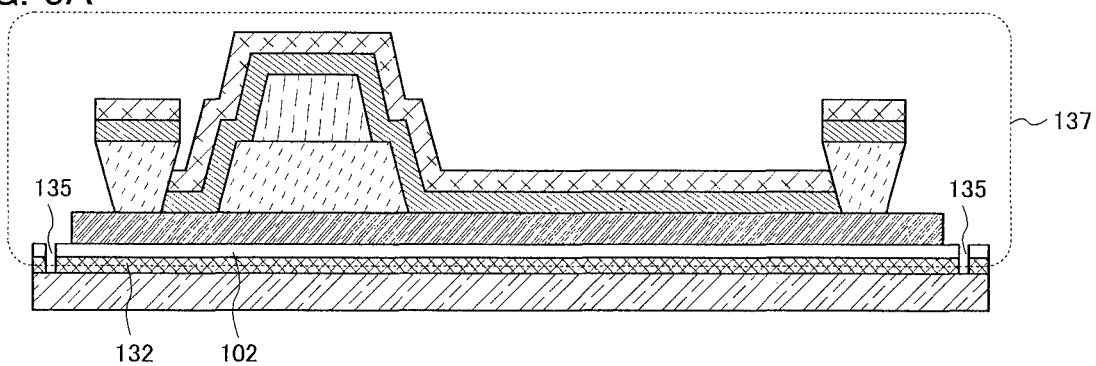
FIGS. 5A and 5B are cross-sectional views illustrating a manufacturing process of a light-emitting element.

Next, as illustrated in FIG. 4B, by irradiation with a laser beam 134, for example, a UV laser beam, an opening 135 is formed in the separation layer 132 and the base film 102 as illustrated FIG. 5A. In addition, before the irradiation with the laser beam 134, a resin for separation may be provided to cover a stacked body that is formed over the substrate 131.

Part of the separation layer 132 is removed by formation of the opening 135, which enables a stacked structure body 137 including the base film 102, the electrode 111, the spacer 105, the spacer 106, the partition 104a, the partition 104b, the light-emitting layer 112, and the electrode 113 to be easily separated from the substrate 131. This separation occurs inside the separation layer 132 or at the interface between the separation layer 132 and the base film 102.

Although a UV laser beam is used as the laser beam 134 in this embodiment, there is no particular limitation on the kind of the laser beam 134 as long as the opening 135 can be formed.

A laser which emits the laser beam 134 includes a laser medium, an excitation source, and a resonator. Lasers can be classified according to their media into gas lasers, liquid lasers, and solid-state lasers and can be classified according to their oscillation characteristics into free electron lasers, semiconductor lasers, and x-ray lasers. In this embodiment, any of these lasers may be used. Note that a gas, laser or a solid-state laser is preferably used, and a solid-state laser is more preferably used.

Examples of gas lasers include a helium-neon laser, a carbon dioxide gas laser, an excimer laser, and an argon ion laser. Examples of an excimer laser include a rare gas excimer laser and a rare gas halide excimer laser. A rare gas excimer laser oscillates with three kinds of excited molecules of argon, krypton, and xenon. Examples of an argon ion laser include a rare gas ion laser and a metal vapor ion laser.

Examples of a liquid laser include an inorganic liquid laser, an organic chelate laser, and a dye laser. In an inorganic liquid laser and an organic chelate laser, rare earth ions of neodymium or the like, which are utilized in a solid-state laser, are used as a laser medium.

A laser medium used in a solid-state laser is a solid base doped with active species functioning as a laser. The solid base is a crystal or glass. A crystal is YAG (yttrium aluminum garnet crystal), YLF, YVO$_4$, YAlO$_3$, sapphire, ruby, or alexandrite. Active species functioning as a laser are, for example, trivalent ions (such as $Cr^{3+}$, $Nd^{3+}$, $Yb^{3+}$, $Tm^{3+}$, $Ho^{3+}$, $Er^{3+}$, and $Ti^{3+}$).

When ceramic (polyerystal) is used as the laser medium, the medium can be formed into any desired shape in a short amount of time at low cost. In the ease of using a single crystal, a columnar medium having a diameter of several millimeters and a length of several tens of millimeters is generally used; in the case of using ceramic (polycrystal), a medium larger than that can be formed. The concentration of a depart such as Nd or Yb in a medium which directly contributes to light emission cannot be changed largely either in a single crystal or in a polycrystal. Therefore, there is limitation to some extent on improvement of laser output by increasing the concentration. However, in the case of using ceramic as the medium, a drastic improvement of output can be achieved because the size of the medium can be significantly increased compared to that of a single crystal. Furthermore, in the case of using ceramic, a medium having a parallelepiped shape or a rectangular solid shape can be easily formed. When a medium having such a shape is used and emitted light is made to propagate inside the medium in zigzag, the optical path of emitted light can be extended. Therefore, the amplitude is increased and a laser beam can be oscillated with high output. In addition, because a laser beam emitted from a medium having such a shape has a quadrangular cross-sectional shape at the time of emission, it is advantageous over a circular beam in being shaped into a linear beam. By shaping the laser beam emitted as described above through an optical system, a linear beam having a length of 1 mm or less on a shorter side and a length of several millimeters to several meters on a longer side can be easily obtained. Further, by uniformly irradiating the medium with excited light, the linear beam has a uniform energy distribution in a longer-side direction. By irradiating a semiconductor film with this linear beam, the entire surface of the semiconductor film can be annealed uniformly, When uniform annealing with the linear beam from one end to the other end is needed, a device of providing a slit at both of the ends so as to block an energy attenuated portion of the beam is necessary.

Note that a continuous-wave (CW) laser beam or a pulsed laser beam can be used as the laser beam 134 in this embodiment. The conditions for irradiation with the laser beam 134, such as frequency, power density, energy density, or beam profile, are controlled as appropriate in consideration of the thicknesses, the materials, or the like of the base film 102 and the separation layer 132.

Figure 5B:
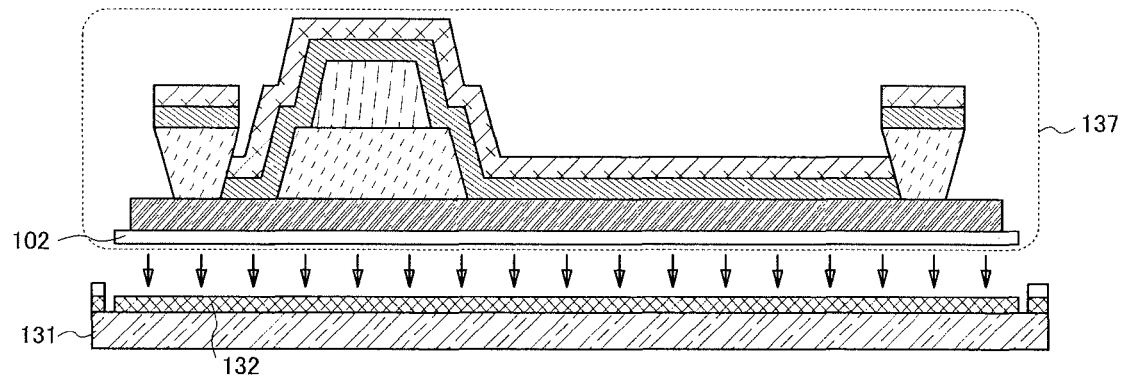

Next, the stacked structure body 137 including the base film 102, the electrode 111, the spacer 105, the spacer 106, the partition 104a, the partition 104b, the light-emitting layer 112, and the electrode 113 is separated from the substrate 131 (see FIG. 5B).

Figure 6A:
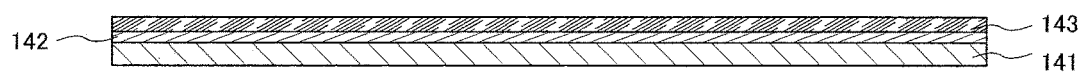
FIGS. 6A to 6C are cross-sectional views illustrating a manufacturing process of a light-emitting element.

In addition, an insulating film 142 and an adhesive layer 143 are formed over a substrate 141 (see FIG. 6A). Note that the insulating film 142 may be formed as necessary and does not need to be formed if not necessary.

The substrate 141 is flexible and has a light-transmitting property. As such a substrate, a plastic substrate which has a light-transmitting property, or the like may be used. For example, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyimide resin, a cycloolefin resin, a polystyrene resin, a polyamide imide resin, a polyvinylchloride resin, or the like can be used as appropriate.

For the insulating film 142, any of the materials mentioned in the description of the base film 102 may be used.

For the adhesive layer 143, any of a variety of types of curable adhesives, e.g., a photocurable adhesive such as a UV curable adhesive, a reactive curable adhesive, a thermosetting; adhesive, and an anaerobic adhesive, can be used. As examples of materials of such adhesives, an epoxy resin, an acrylic resin, a silicone resin, a phenol resin, and the like can be given.

Figure 6B:
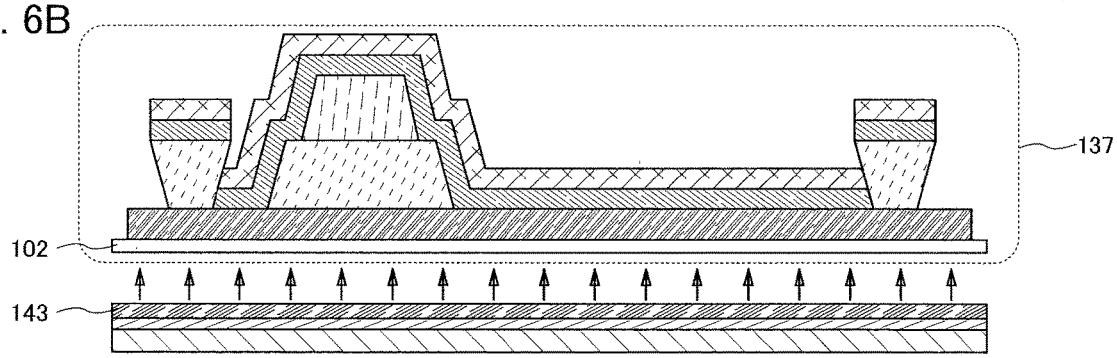

Next, the base film 102 included in the stacked structure body 137 and the adhesive layer 143 over the substrate 141 are disposed to face each other and attached to each other (see FIG. 6B).

Figure 6C:
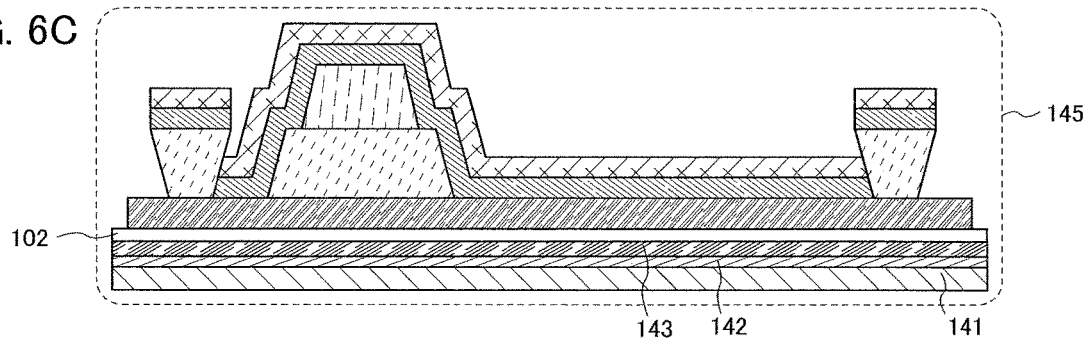

In the aforementioned manner, a light-emitting element 145 is manufactured over a flexible substrate (see FIG. 6C).

Next, a semiconductor circuit for driving a light-emitting element and a method for manufacturing the semiconductor circuit are hereinafter described with reference to FIGS. 7A to 7D, FIGS. 8A to 8C, FIGS. 9A to 9C, FIGS. 10A and 10B, FIG. 11, FIG. 12, FIGS. 14A and 14B, FIG. 15, FIG. 16, FIGS. 17A and 17B, FIGS. 18A and 18B, FIG. 19, FIG. 20, FIG. 21, and FIGS. 23A and 23B.

Figure 7A:
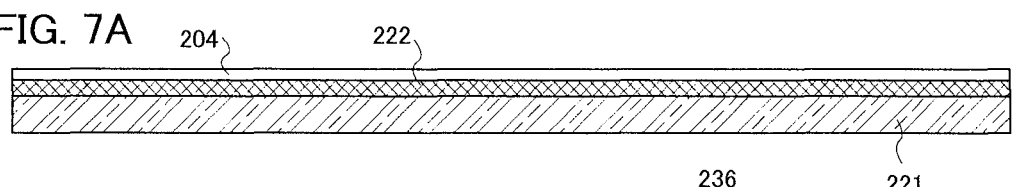
FIGS. 7A to 7D are cross-sectional views illustrating a manufacturing process of a semiconductor circuit element.

First, a separation layer 222 and a base film 204 are formed over a substrate 221 (see FIG. 7A). The substrate 221, the separation layer 222, and the base film 204 may be formed using, any of the respective materials mentioned in the description of the substrate 131, the separation layer 132, and the base film 102.

Figure 7B:
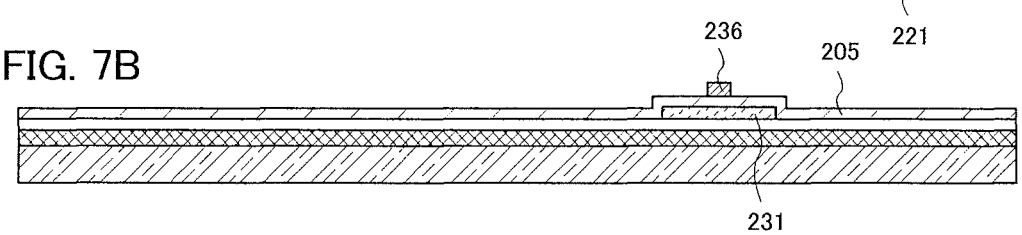

Next, an island-like semiconductor film 231 is thrilled over the base film 204; a gate insulating film 205 is formed to cover the base film 204 and the island-like semiconductor film 231; and a gate electrode 236 is formed over the island-like semiconductor film 231 with the gate insulating film 205 interposed therebetween (see FIG. 7B).

The island-like semiconductor film 231 can be formed using any of the following materials: an amorphous semiconductor manufactured by a sputtering method or a vapor-phase growth method using a gas including a semiconductor material typified by silicon (Si) or germanium (Ge); a polycrystalline semiconductor formed by crystallizing the amorphous semiconductor with the use of optical enemy or thermal energy; a microcrystalline (also referred to as semi-amorphous or microcrystal) semiconductor; a semiconductor containing an organic material as its main component; and the like. The island-like semiconductor film 231 may be formed by forming a semiconductor film by a sputtering method, an LPCVD method, a plasma CVD method, or the like and then etching the semiconductor film into an island-like shape. In this embodiment, an island-like silicon film is formed as the island-like semiconductor film 231.

As a material of the island-like semiconductor film 231, as well as an element such as silicon (Si) or germanium (Ge), a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor including two or more of the above oxide semiconductors, or the like can be used. For example, an oxide semiconductor including zinc oxide, indium oxide, and gallium oxide can also be used. In the case of using zinc oxide for the island-like semiconductor film 231, the gate insulating film 205 may be formed using $Y_2O_3$, $Al_2O_3$, or $TiO_2$, a stacked layer thereof, or the like, and the gate electrode 236 and an electrode 215a and an electrode 215b which are to be described below may be formed using ITO, Au, Ti, or the like. In addition, In, Ga, or the like can be added to ZnO.

The gate electrode 236 may be formed by a CVD method, a sputtering method, a droplet discharge method, or the like using an element selected from Ag, Au, Cu, Ni, Pt, Pd, Ir, Rh, W, Al, Ta, Mo, Cd, Zn, Fe, Ti, Si, Ge, Zr, and Ba or an alloy material or a compound material containing any of the elements as its main component. In addition, a semiconductor film typified by a polycrystalline silicon film doped with an impurity element such as phosphorus, or an AgPdeu alloy may be used. Further, either a single layer structure or a stacked structure of a plurality of layers may be employed.

Figure 7C:
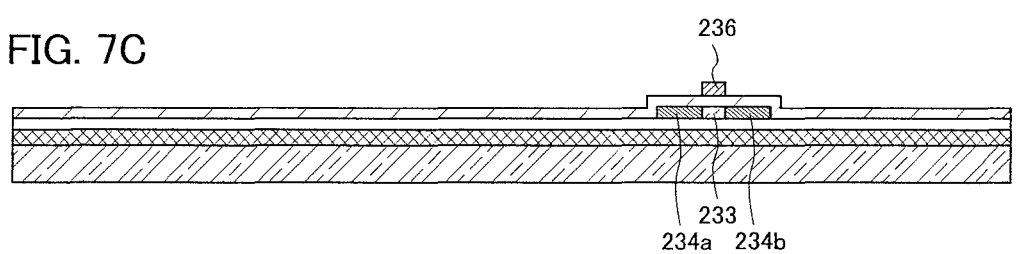

In addition, a channel formation region 233, a region 234a which is one of a source region and a drain region, and a region 234b which is the other of the source region and the drain region are formed in the island-like semiconductor film 231 (see FIG. 7C). The region 234a and the region 234b may be formed by adding an impurity element having one conductivity type to the island-like semiconductor film 231 with the gate electrode 236 used as a mask. As the impurity element having one conductivity type, phosphorus (P) or arsenic (As) which is an impurity element imparting n-type conductivity or boron (B) which is an impurity element imparting p-type conductivity may be used.

A low-concentration impurity region may be formed in each of regions between the channel formation region 233 and the region 234a and between the channel formation region 233 and the region 234b.

Figure 7D:
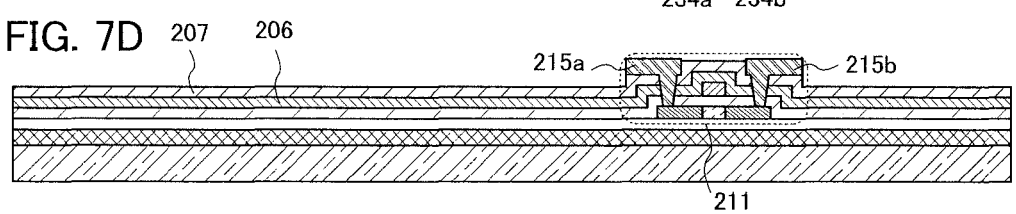

Next, an insulating film 206 and an insulating film 207 are formed to cover the gate insulating film 205 and the gate electrode 236. Furthermore, an electrode 215a which is electrically connected to the region 234a and an electrode 215b which is electrically connected to the region 234b are formed over the insulating film 207. In the aforementioned manner, a TFT 211 which is included in a semiconductor circuit is manufactured (see FIG. 7D). Note that although a single TFT is illustrated in FIG. 7D, two or more TFTs may be provided. A semiconductor circuit may be formed with a plurality of TFTs that are electrically connected to each other.

The insulating film 206 and the insulating film 207 may each be formed using any of the materials mentioned in the description of the base film 204. In this embodiment, a silicon nitride film containing oxygen is formed as the insulating film 206, and a silicon oxide film containing nitrogen is formed as the insulating film 207.

This is in order to terminate dangling bonds in the la ke semiconductor film 231 with hydrogen contained in the silicon nitride film containing oxygen through heat treatment. Alternatively, either the insulating film 206 or the insulating film 207 may be formed as necessary.

The electrode 215a and the electrode 215b may be formed using any of the materials mentioned in the description of the gate electrode 236.

Figure 8A:
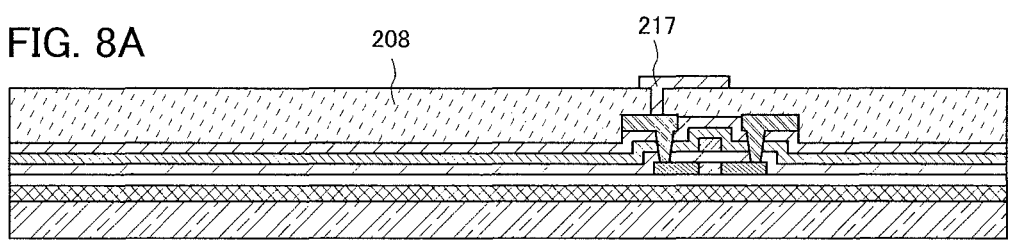
FIGS. 8A to 8C are cross-sectional views illustrating a manufacturing process of a semiconductor circuit element.

Next, an insulatintg film 208 is formed to cover the insulating film 207, the electrode 215a, and the electrode 215b, and an electrode 217 which is electrically connected to one of the electrode 215a and the electrode 215b is formed over the insulating film 208 (see FIG. 8A).

The insulating film 208 may be formed using an organic insulating material or an inorganic insulating material.

As an inorganic material, silicon oxide, silicon nitride, silicon oxide containing nitrogen, or diamond-like carbon (DLC) or a stacked structure of two or more of these materials can be used. As an organic material, polyimide, acrylic, polyamide, polyimide amide, resist, benzocyclobutene, or siloxane or a stacked structure of two or more of these materials may be used.

The electrode 217 may be formed using any of the materials mentioned in the description of the gate electrode 236.

Figure 8B:
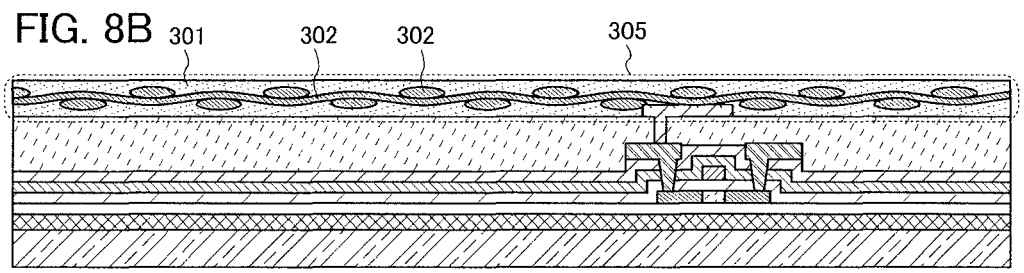

A structure body 305 in which a sheet-like fibrous body 302 is impregnated with an organic resin 301 is provided over the insulating film 208 and the electrode 217 (see FIG. 8B). Such a structure body 305 is also called a prepreg. A prepreg is specifically formed in the following manner: after a sheet-like fibrous body is impregnated with a composition in which a matrix resin is diluted with an organic solvent, drying is performed so that the organic solvent is volatilized and the matrix resin is semi-cured.

In the drawings of this specification, the sheet-like fibrous body 302 is illustrated as a woven fabric which is plainwoven using yarn bundles with an elliptical cross-sectional shape. Although the size of the TFT 211 is larger than the width of a yarn bundle of the sheet-like fibrous body 302, the size of the TFT 211 may be smaller than the width of a yarn bundle of the sheet-like fibrous body 302 in some cases.

The structure body (also called "prepreg") 305 including the sheet-like fibrous body 302 and the oranic resin 301 is hereinafter described in detail with reference to FIGS. 14A and 14B, FIG. 15, FIG. 16, and FIGS. 17A and 17B.

Figure 14A:
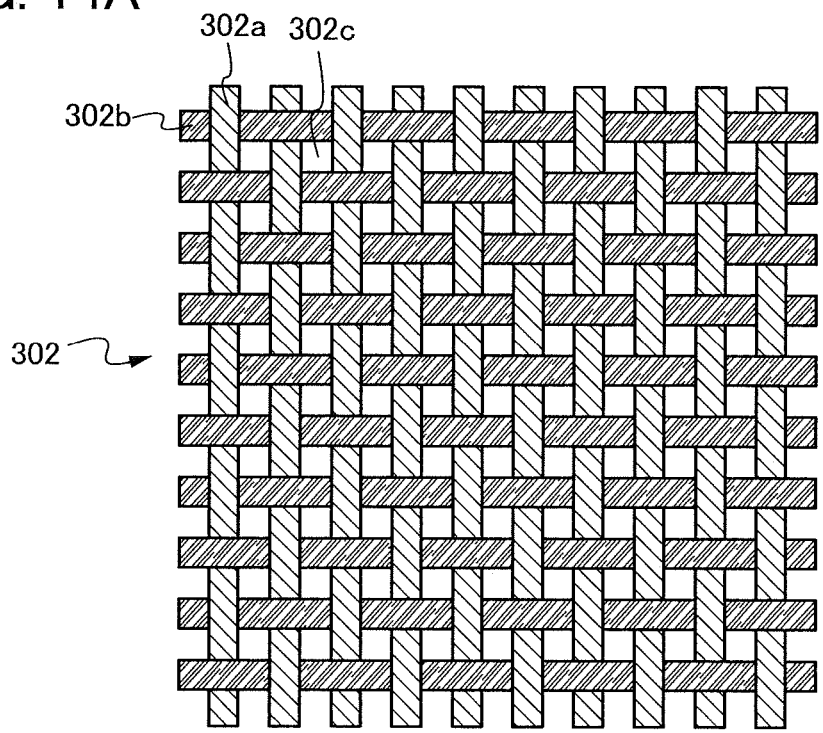
FIGS. 14A and 14B are top views of a sheet-like fibrous body.
Figure 14B:
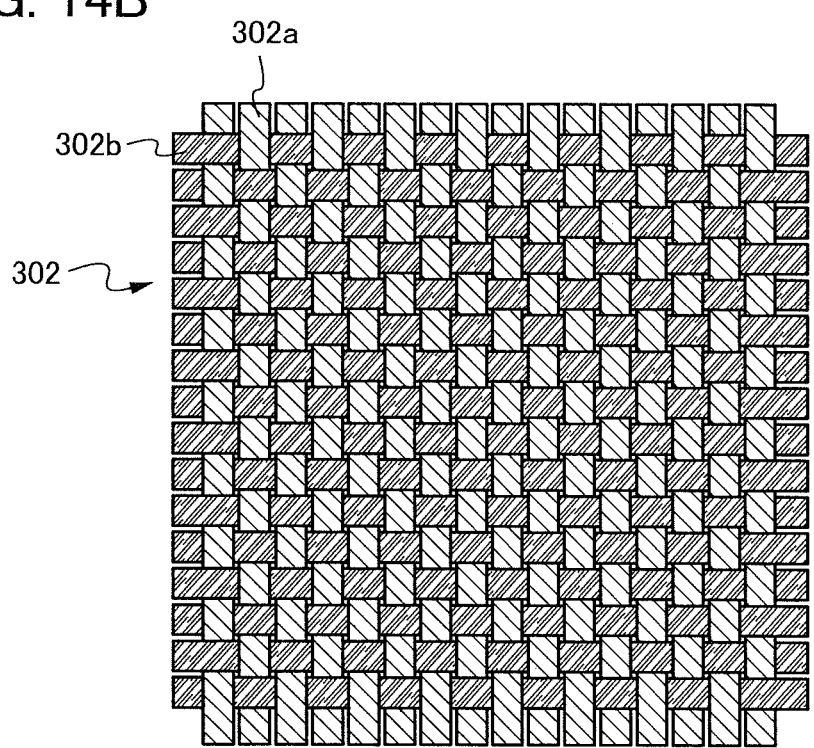
Figure 17A:
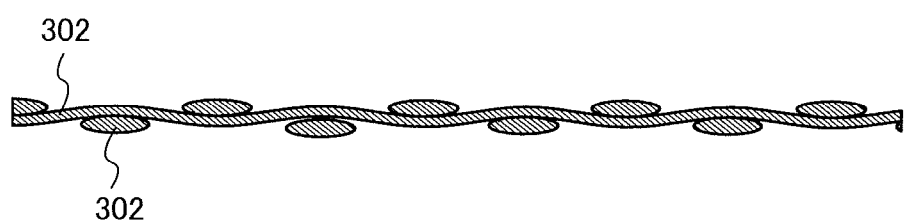
FIGS. 17A and 17B are as cross-sectional view of a sheet-like fibrous body and a cross-sectional view of a structure body, respectively.
Figure 17B:
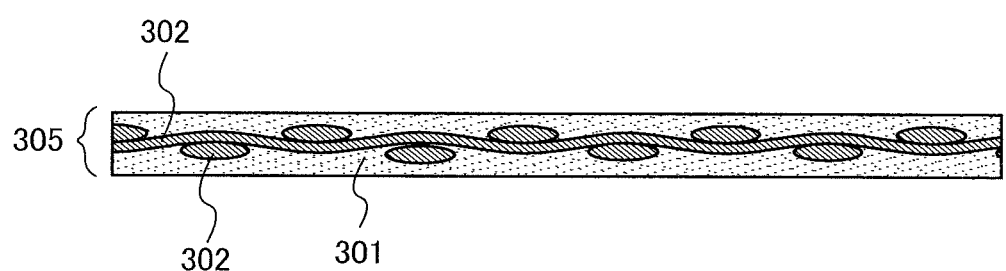

A top view of a woven fabric which is the sheet-like fibrous body 302 woven using yarn bundles as warp yarns and weft yarns is illustrated in FIGS. 14A and 14B, and a cross-sectional view thereof is illustrated in FIG. 17A. In addition, a cross-sectional view of the structure body 305 in which the sheet-like fibrous body 302 is impregnated with the organic resin 301 is illustrated in FIG. 17B.

The sheet-like fibrous body 302 is a woven fabric or a nonwoven fabric of an organic compound or an inorganic compound. Alternatively, as the sheet-like fibrous body 302, a high-strength fiber of an organic compound or an inorganic compound may be used.

Alternatively, the sheet-like fibrous body 302 may be a woven fabric which is woven using bundles of fibers (single yarns) (hereinafter, the bundles of fibers are referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a circular cross-sectional shape or an elliptical cross-sectional shape. As the yarn bundle, a yarn bundle may be used which has been subjected to fiber opening with a high-pressure water stream high-frequency vibration using liquid as a medium, continuous ultrasonic vibration, pressing with a roller, or the like. A yarn bundle which has been subjected to fabric opening has a larger width, has a smaller number of single yarns in the thickness direction, and has an elliptical cross-sectional shape or a flat cross-sectional shape. Furthermore, by using a loosely twisted yarn as the yarn bundle, the yarn bundle is easily flattened and has an elliptical cross-sectional shape or a flat cross-sectional shape. By using yarn bundles having an elliptical cross-sectional shape or a flat cross-sectional shape as described above, it is possible to reduce the thickness of the sheet-like fibrous body 302. Accordingly, the structure body 305 can be made thin, and thus, a thin semiconductor device can be manufactured.

As illustrated in FIG. 14A, the sheet-like fibrous body 302 is woven using warp yarns 302a spaced at regular intervals and weft yarns 302b spaced at regular intervals. Such a fibrous body has regions without the warp yarns 302a and the weft yarns 302b (referred to as basket holes 302c). Such a sheet-like fibrous body 302 is further impregnated with the organic resin 301, whereby adhesiveness of the sheet-like fibrous body 302 can be further increased. Note that although neither the warp yarns 302a nor the welt yarns 302b exist in the basket holes 302c of the structure body 305, the basket holes 302c are filled with the organic resin 301. IOH7i As illustrated in FIG. 14B, in the sheet-like fibrous body 302, the density of the warp yarns 302a and the weft yarns 302b may be high and the proportion of the basket holes 302c may be low. Typically, the size of the basket hole 302c is preferably smaller than the area of a locally pressed portion. More typically, the basket hole 302c preferably has a rectangular shape having a side with a length of 0.01 mm to 0.2 mm.

When the basket hole 302c of the sheet-like fibrous body 302 has such a small area, even when pressure is applied by a member with a sharp tip (typically, a writing, instrument such as a pen or a pencil), the pressure can be absorbed by the entire sheet-like fibrous body 302.

Furthermore, in order to enhance the permeability of the organic resin 301 into the inside of the yarn bundles, the yarn bundles may be subjected to surface treatment. For example, as the surface treatment, corona discharge treatment, plasma discharge treatment, or the like for activating a surface of the yarn bundle can be given. Moreover, surface treatment using a silane coupling agent or a titanate coupling agent can be given.

A high-strength fiber is specifically a fiber with a high tensile modulus of elasticity or a fiber with a high Young's modulus. As typical examples of a high-strength fiber, a polyvinyl alcohol fiber, a polyester fiber, a polyamide fiber, a polyethylene fiber, an aramid fiber, a polyparaphenylene benzobisoxazole fiber, a glass fiber, and a carbon fiber can be given. As the glass fiber, a glass fiber using E glass, S glass, D glass, Q glass, or the like can be used. Note that the sheet-like fibrous body 302 may be formed from one or more kinds of the above-mentioned high-strength fibers.

As the organic resin 301 with which the sheet-like fibrous body 302 is impregnated, a thermosetting resin such as an epoxy resin, an unsaturated polyester resin, a polyimide resin, a bismaleimide-triazine resin, or a cyanate resin can be used. Alternatively; a thermoplastic resin such as a polyphenylene oxide resin, a polyetherimide resin, or a fluorine resin may be used. Further alternatively, a plurality of the above-mentioned thermosetting resins and thermoplastic resins may be used. By using the above-mentioned organic resin, the sheet-like fibrous body can be fixed to a semiconductor element layer by heat treatment. The higher the glass transition temperature of the organic resin 301 is, the less easily the organic resin 301 is damaged by local pressure; thus, the organic resin 301 preferably has high glass transition temperature.

Highly thermally conductive filler may be dispersed in the organic resin 301 or in yarn bundles of a fiber. Examples of the highly thermally conductive filler include aluminum nitride, boron nitride, silicon nitride, alumina, and metal particles of silver, copper, or the like. When the highly thermally conductive filler is included in the organic resin or the yarn bundles, heat generated in an element layer can be easily released to the outside. Accordingly, thermal storage in a semiconductor device can be suppressed, and damage to the semiconductor device can be reduced.

Figure 15:
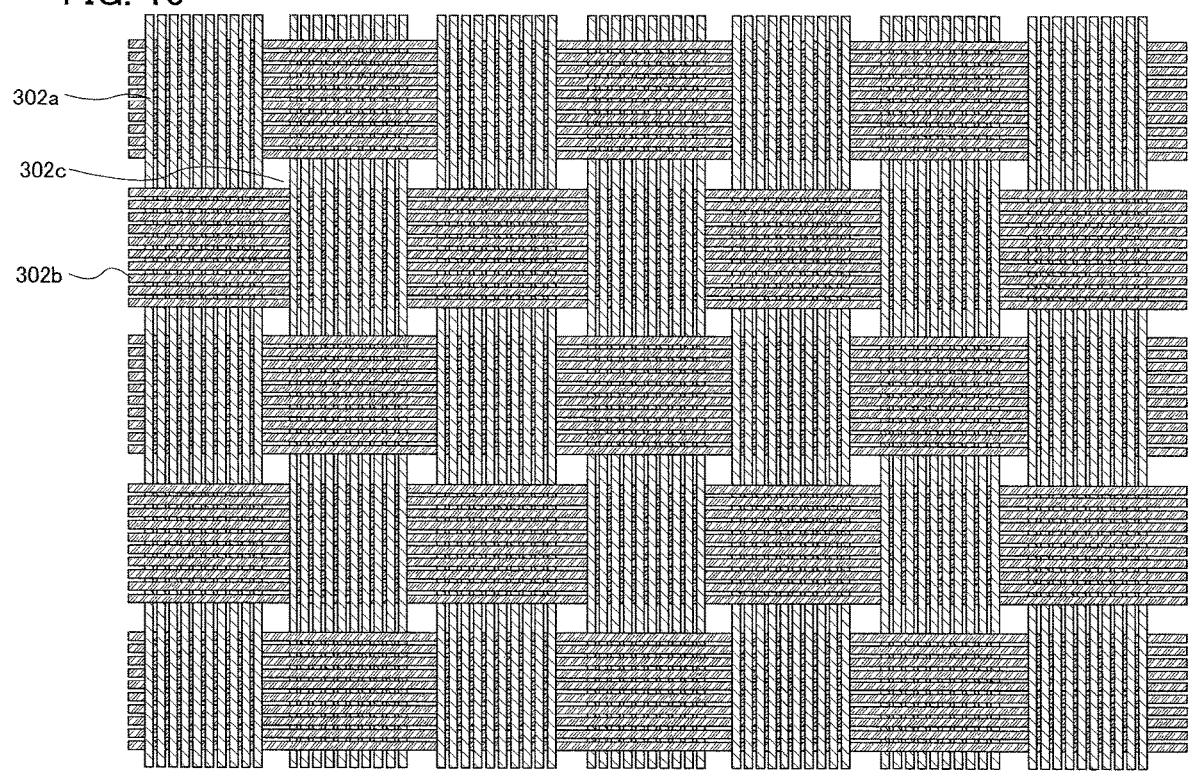
FIG. 15 is a top view of a sheet-like fibrous body.
Figure 16:
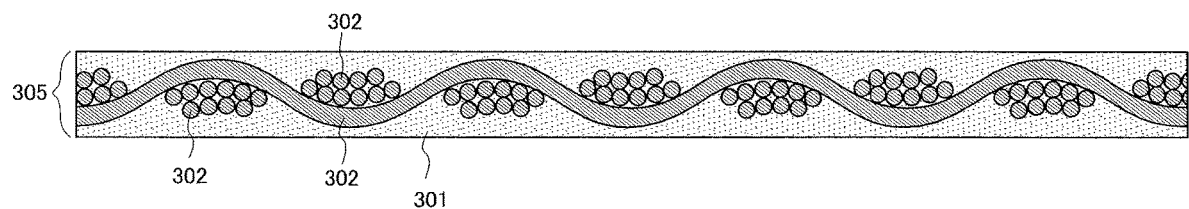
FIG. 16 is a cross-sectional view of a structure body.

Note that FIGS. 14A and 14B illustrate a sheet-like fibrous body woven using alternate warp and weft yarns. However, the number of warp yarns and that of weft yarns are not limited to these. The number of warp yarns and that of weft yarns may be determined as needed. For example, FIG. 15 is a top view of a sheet-like fibrous body woven using warp yarns and weft yarns each including ten yarns, and FIG. 16 illustrates a cross-sectional view thereof. In FIG. 15, the sheet-like fibrous body 302 is impregnated with the organic resin 301 to form the structure body 305.

Figure 8C:
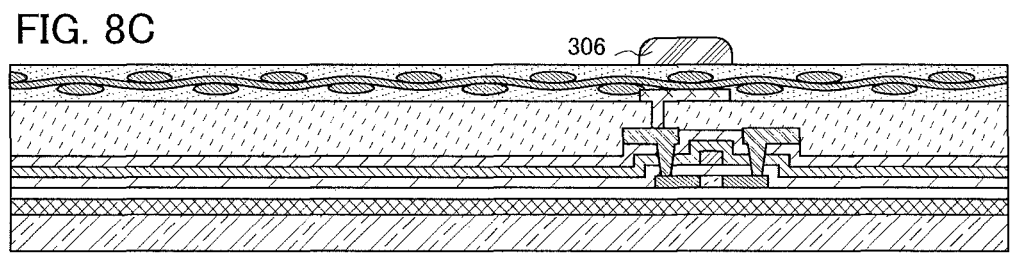

Next, a conductive resin 306 is disposed over the structure body 305 and over the electrode 217 (see FIG. 8C). In this embodiment, a conductive paste including a metal element, for example, silver paste, is used as the conductive resin 306. The metal element may be included in the conductive paste as metal particles.

The conductive paste may be any paste that includes copper (Cu), silver (Ag), nickel (Ni), gold (Au), platinum (Pt), palladium (Pd), tantalum (Ta), molybdenum (Mo), or titanium (Ti).

As a method for disposing the conductive resin 306 over the structure body 305, a screen printing method or an inkjet method may be employed.

When the conductive resin 306 is disposed over the structure body 305, the organic resin 301 in the structure body 305 reacts with a component of the conductive resin 306 and, for example, in the case of using a conductive paste, the organic resin 301 reacts with the paste. Thus, part of the organic resin 301 is dissolved and metal particles in the conductive resin 306 pass through interstices in the sheet-like fibrous body 302 and move to a surface (a second surface) opposite to the surface over which the conductive resin 306 is disposed first (a first surface). Accordingly, a through electrode, is formed, in the structure body 305 (see FIG. 9A).

Note that the area of the conductive resin 306 on the second surface of the structure body 305 may be smaller or larger than the area on the first surface. That is, the conductive resin 306 may contract or expand while moving in the structure body 305.

Because a through hole (also referred to as a contact hole) is not formed in the structure body 305, that is, because the sheet-like fibrous body 302 is not divided, one surface of the structure body 305 can be electrically connected to the other surface without reducing the strength of the structure body 305.

After that, a heating step and a pressure bonding step are performed to cure an undissolved portion of the organic resin 301 in the structure body 305.

A stacked structure from the substrate 221 to the structure body 305 and the conductive resin 306 are herein referred to as a stacked structure body 237.

Figure 9A:
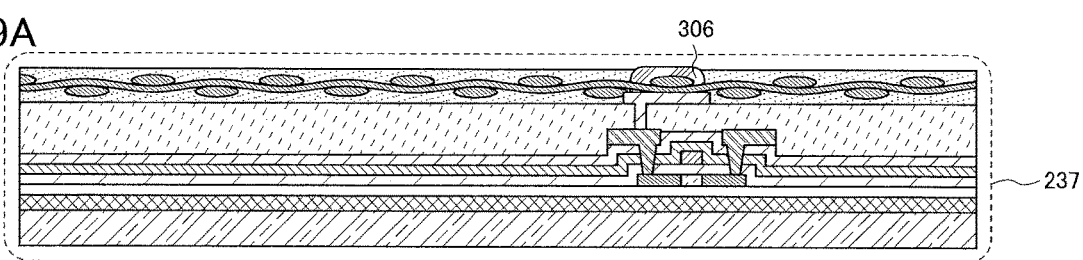
FIGS. 9A to 9C are cross-sectional views illustrating a manufacturing process of a semiconductor circuit element.
Figure 9B:
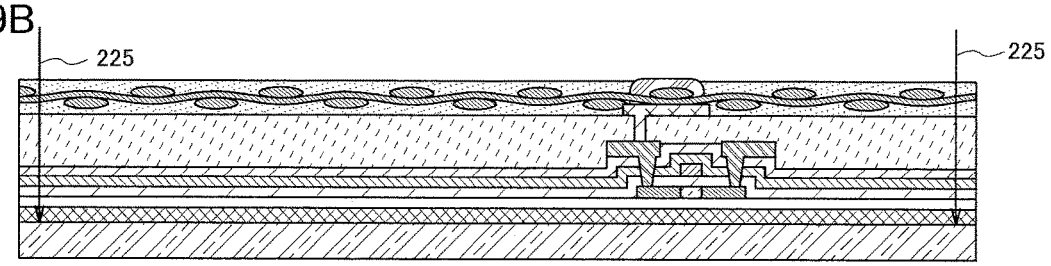
Figure 9C:
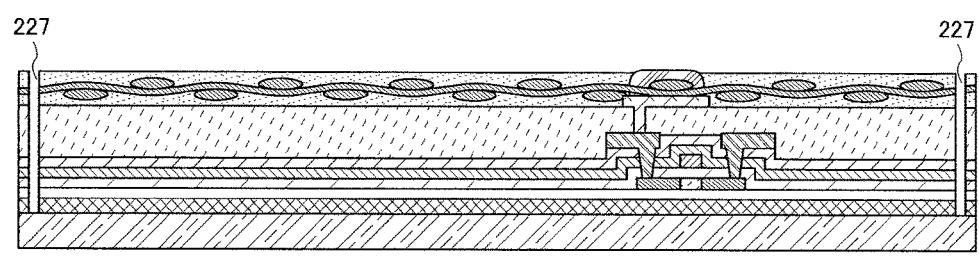

Next, in order to facilitate a later separation step, the stacked structure from the separation layer 222 to the structure body 305 may be irradiated with a laser beam 225 from the structure body 305 side as illustrated in FIG. 9B to form a groove 227 in the stacked structure including the separation layer 222, the base film 204, the gate insulating film 205, the insulating film 206, the insulating film 207, the insulating film 208, and the structure body 305 as illustrated in FIG. 9C. The laser beam 225 may be any of the laser beams mentioned in the description of the laser beam 134.

Figure 10A:
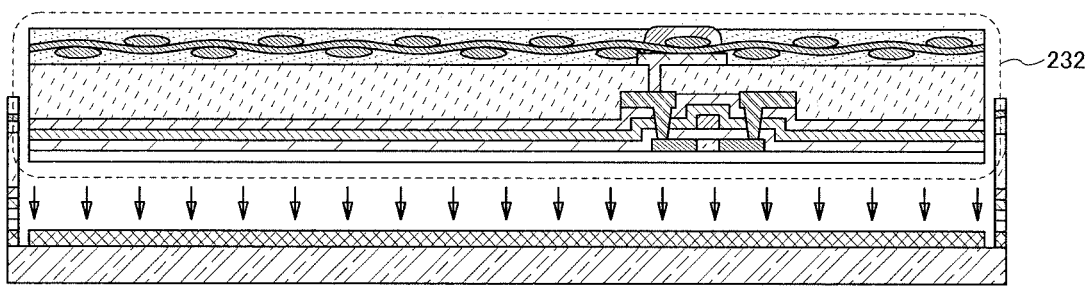
FIGS. 10A and 10B are cross-sectional views illustrating a manufacturing process of a semiconductor circuit element.

Next, using the groove 227 as a trigger, the substrate 221 provided with the separation layer 222 is separated from a stacked structure body 232 including the base film 204, the gate insulating film 205, the insulating film 206, the insulating film 207, the insulating film 208, the structure body 305, and the TFT 211, at the interface between the separation layer 222 and the base film 204 by a physical means (see FIG. 10A).

The physical means refers to a dynamic means or a mechanical means, which applies some dynamical energy (mechanical energy). Typically, the physical means is an action of applying mechanical force (e.g., a peeling process with human hands or with a gripper, or a separation process with a rotating roller). At this time, when an adhesive sheet which can be separated by light or heat is provided over a surface of the structure body 305, separation can be performed more easily.

Alternatively, the stacked structure body 232 may be separated from the separation layer 222 by dropping a liquid into the groove 227 to allow the liquid to be infiltrated into the interface between the separation layer 222 and the base film 204. In this case, a liquid may be dropped only into the groove 227, or the stacked structure manufactured over the substrate 221 may be entirely soaked in a liquid so that the liquid is infiltrated from the groove 227 into the interface between the separation layer 222 and the base film 204.

Alternatively, in FIG. 9C, a method can be employed in which a fluoride gas such as $NF_3$, $BrF_3$, or $ClF_3$ is introduced into the groove 227 and the separation layer 222 is removed by etching with the use of the fluoride gas so that the stacked structure body 232 is separated from the substrate 221.

In addition, a substrate 201 provided with an insulating film 202 and an adhesive layer 203 is prepared, and then, the base film 204 included in the stacked structure body 232 and the adhesive layer 203 over the substrate 201 are disposed to face each other and attached to each other. The substrate 201, the insulating film 202, and the adhesive layer 203 may be formed using the respective materials mentioned in the description of the substrate 141, the insulating film 142, and the adhesive layer 143. In the manner mentioned above, a semiconductor circuit element 235 is manufactured (see FIG. 10B).

Next, the light-emitting element 145 and the semiconductor circuit element 235 are disposed to face each other (see FIG. 1). At this time, these elements are disposed to face each other such that the projecting portion of the electrode 113 and the conductive resin 306 overlap each other.

Figure 11:
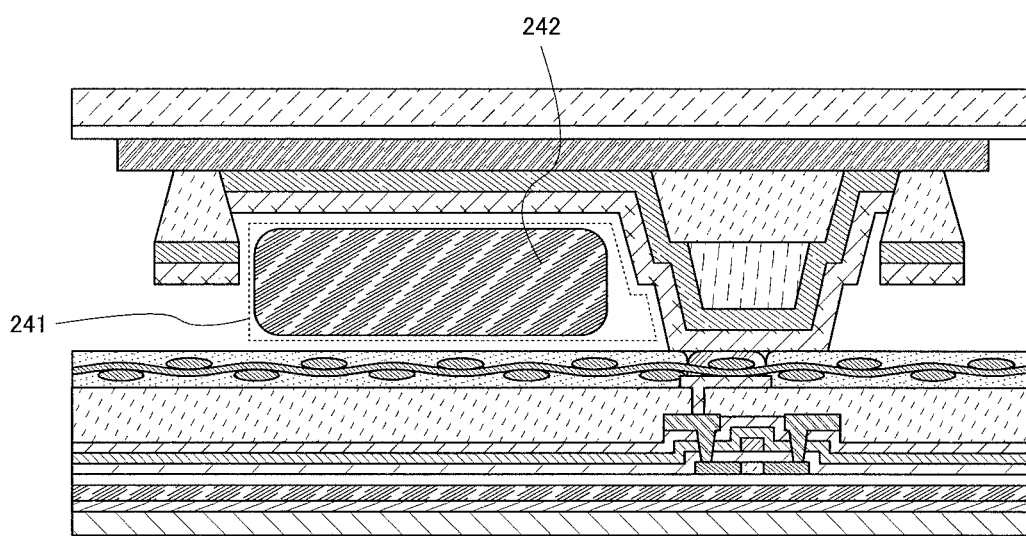
FIG. 11 is a cross-sectional view of a light-emitting device.

A case where the projecting portion of the electrode 113 and the conductive resin 306 are directly bonded to each other is illustrated in FIG. 11. Before the direct bonding, surfaces of the light-emitting element 145 and the semiconductor circuit element 233 are preferably subjected to plasma treatment. In addition, when electric current is applied between the electrode 113 and the conductive resin 306, the bonding is strengthened.

In addition, a space 241 surrounded by the electrode 113, the partition 104a, and the structure body 305 is generated, and in the case where a desiccant 242 is provided in the space 241, the entry of moisture into the light-emitting layer 112 can be prevented.

Furthermore, because the space 241 exists, stress can be relaxed even when the substrate 141 and the substrate 201 are bent.

Figure 12:
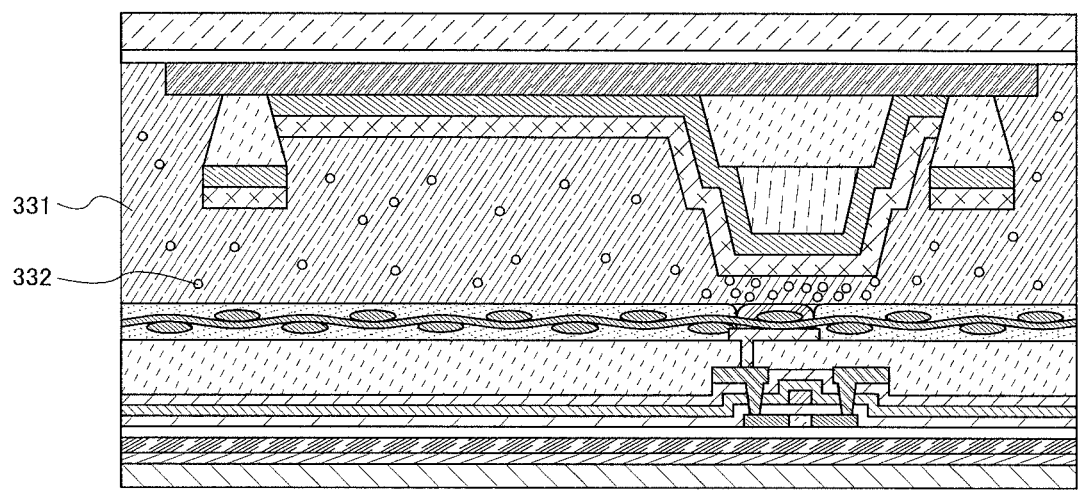
FIG. 12 is a cross-sectional view of a light-emitting device.

An example in which the light-emitting element 145 and the semiconductor circuit element 235 are attached to each other with an anisotropic conductive resin film 331 is illustrated in FIG. 12. As the anisotropic conductive resin film 331, an anisotropic conductive paste (ACP), an anisotropic conductive film (ACF), and the like can be given as examples. By attaching the light-emitting element 145 and the semiconductor circuit element 235 to each other with the anisotropic conductive resin film 331, the projecting portion of the electrode 113 and the conductive resin 306 are electrically connected to each other through conductive particles 332 which are contained in the anisotropic conductive resin film 331. Because the anisotropic conductive resin film 331 conducts electricity only in a longitudinal direction, only a portion between the projecting portion of the electrode 113 and the conductive resin 306 conducts electricity.

Alternatively, the light-emitting element 145 and the semiconductor circuit element 235 may be attached to each other with a non-conductive paste (NCP).

Figure 10B:
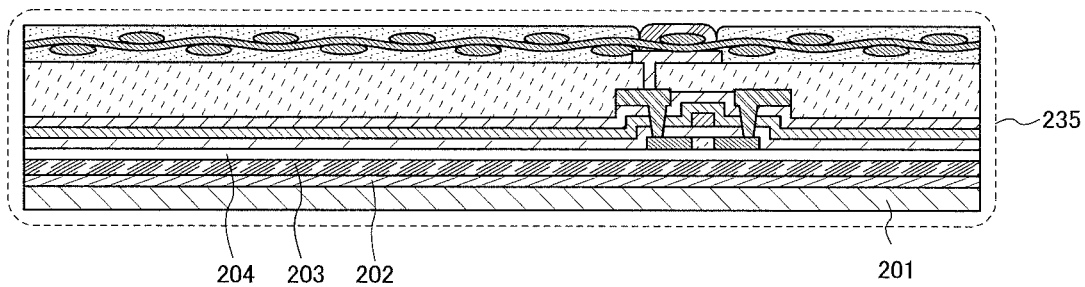

A semiconductor circuit element having a structure different from that in FIG. 10B and a method for manufacturing the semiconductor circuit element, and a light-emitting device and a method for manufacturing the light-emitting device are described with reference to FIGS. 18A and 18B, FIG. 19, FIG. 20, and FIG. 21.

First, based on the manufacturing steps to FIG. 8B, a separation layer 222, a base film 204, a gate insulating film 205, an insulating film 206, an insulating film 207, an insulating film 208, a TFT 261 including an electrode 262 and an electrode 263, and a structure body 305 including a sheet-like fibrous body 302 and an organic resin 301 are formed over a substrate 221.

At this time, the TFT 261 may be formed in a manner similar to the TFT 211, and the electrode 262 and the electrode 263 are formed in place of the electrode 215a and the electrode 215b, respectively. Contact holes are formed in the gate insulating film 205, the insulating film 206, the insulating film 207, and the insulating film 208 to reach a region 234b and the separation layer 222, and one of the electrodes 262 and 263, which is the electrode 263 in this embodiment, is formed in contact with the region 234b and the separation layer 222.

Figure 18A:
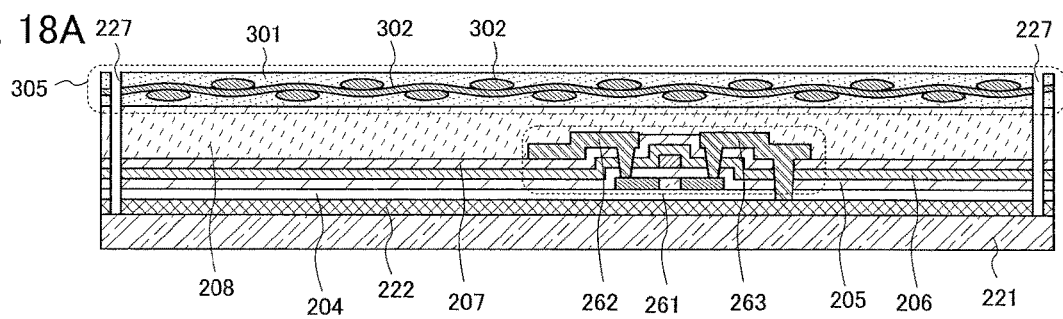
FIGS. 18A and 18B are cross-sectional views illustrating a manufacturing process of a semiconductor circuit element.

Next, based on the manufacturing steps illustrated in FIGS. 9B and 9C, a groove 227 is formed in a stacked structure including the gate insulating film 205, the insulating film 206, the insulating film 207, the insulating film 208, and the structure body 305 (see FIG. 18A).

Figure 18B:
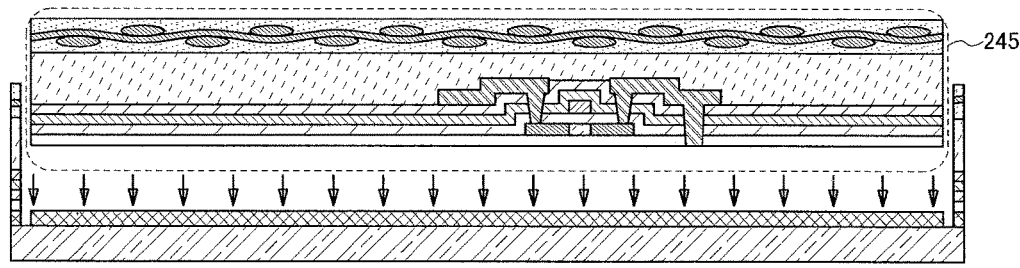

Next, using the groove 227 as a trigger, the substrate 221 provided with the separation layer 222 is separated from a semiconductor circuit element 245 including the base film 204, the gate insulating film 205, the insulating film 206, the insulating film 207, the insulating film 208, the structure body 305, and the TFT 261, at the interface between the separation layer 222 and the base film 204 (see FIG. 18B). Accordingly, the electrode 263 is exposed at a surface of the base film 204.

Figure 19:
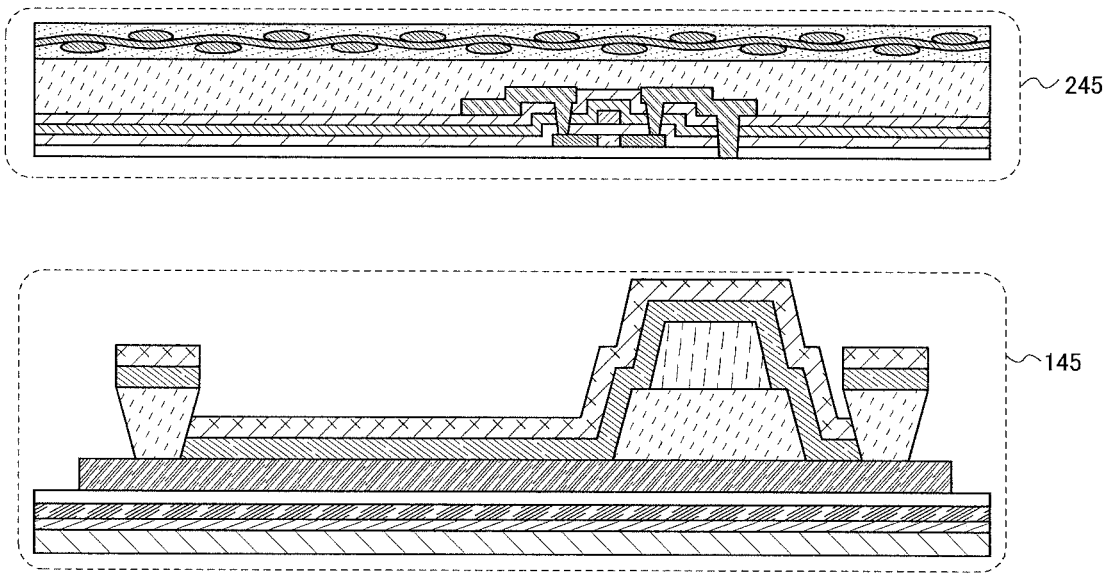
FIG. 19 is a cross-sectional view illustrating a manufacturing process of a light-emitting device.

Next, the base film 204 of the semiconductor circuit element 245 and the electrode 113 of the light-emitting element are disposed to face each other (see FIG. 19). At this time, the projecting portion of the electrode 113 and the electrode 263 exposed at the surface of the base film 204 are arranged to overlap each other.

Figure 20:
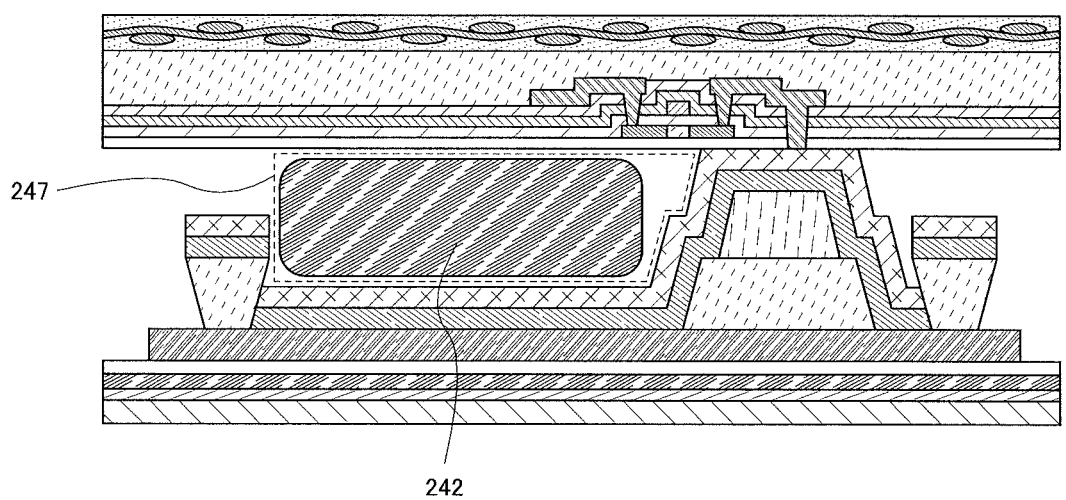
FIG. 20 is a cross-sectional view of a light-emitting device.

A case where the projecting portion of the electrode 113 and the electrode 263 are directly bonded to each other is illustrated in FIG. 20. Before the direct bonding, surfaces of the light-emitting element 145 and the semiconductor circuit element 245 are preferably subjected to plasma treatment. In addition, when electric current is applied between the electrode 113 and the electrode 263, the bonding is strengthened.

In addition, a space 247 surrounded by the electrode 113, the partition 104a, and the base film 204 is generated, and in the case where a desiccant 242 is provided in the space 247, the entry of moisture into the light-emitting layer 112 can be prevented.

Figure 21:
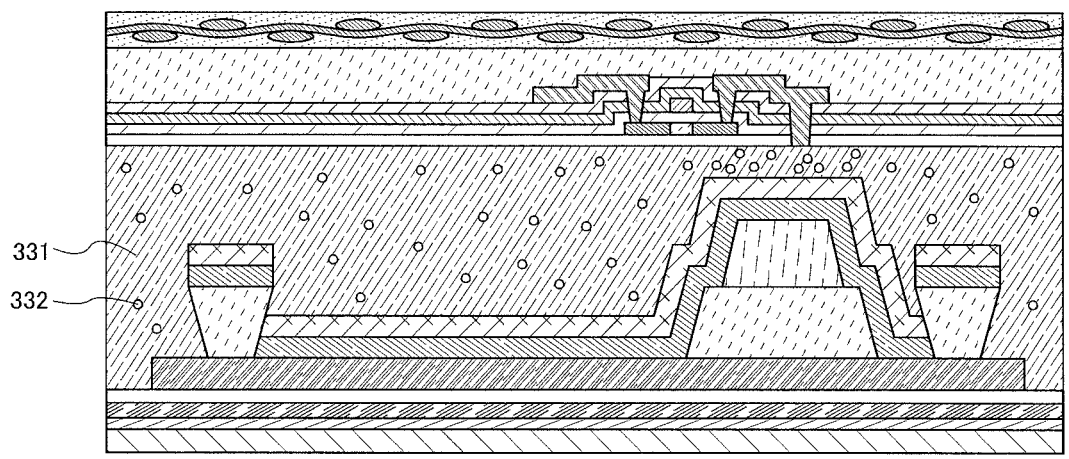
FIG. 21 is a cross-sectional view of a light-emitting device.

An example in which the light-emitting element 145 and the semiconductor circuit element 245 are attached to each other with an anisotropic conductive resin film 331 is illustrated in FIG. 21. By attaching the light-emitting element 145 and the semiconductor circuit element 245 to each other with the anisotropic conductive resin film 331, the projecting portion of the electrode 113 and the electrode 217 are electrically connected to each other through conductive particles 332 which are contained in the anisotropic conductive resin film 331. Because the anisotropic conductive resin film 331 conducts electricity only in a longitudinal direction, only a portion between the projecting portion of the electrode 113 and the electrode 263 conducts electricity.

Alternatively, the light-emitting element 145 and the semiconductor circuit element 245 may be attached to each other with a non-conductive paste (NCP).

A semiconductor circuit element having a structure different from that in a FIG. 10B and a method for manufacturing the semiconductor circuit element, and a light-emitting device and a method for manufacturing the light-emitting device are described with reference to FIGS. 23A and 23B and FIGS. 24A and 24B.

First, based on the manufacturing steps to FIG. 8B, a separation layer 222, a base film 204, a gate insulating film 205, an insulating film 206, an insulating film 207, an electrode 217, an insulating film 208, and a TFT 211 including an electrode 215a and an electrode 215b are formed over a substrate 221.

Figure 23A:
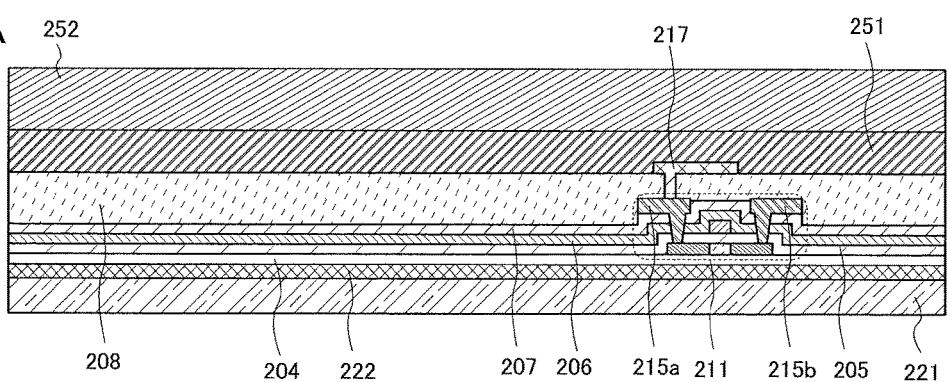
FIGS. 23A and 23B are cross-sectional views illustrating a manufacturing process of a semiconductor circuit element.
Figure 23B:
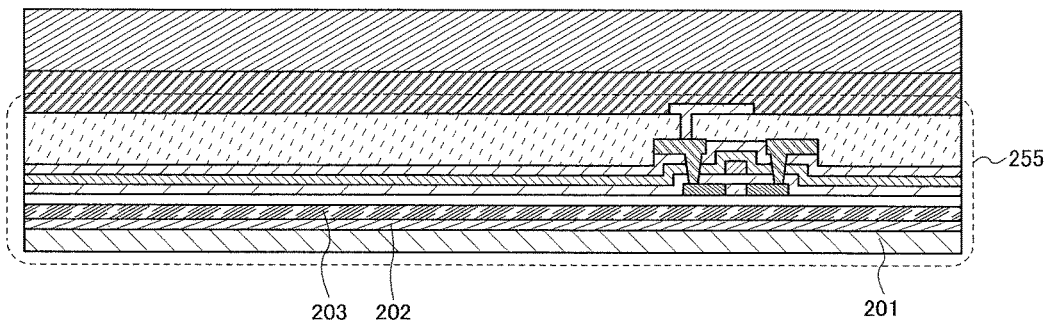

A resin layer 251 and a support 252 are formed over the insulating film 208 and the electrode 217 (see FIG. 23A). In this embodiment, a water-soluble resin is used as the resin layer 251, and UV tape is used as the support 252. Before the resin layer 251 and the support 252 are formed, a groove may be formed by laser beam irradiation in a manner similar to the manufacturing step illustrated in FIG. 9B.

Next, the substrate 221 provided with the separation layer 222 is separated from a semiconductor circuit element 2 including the base film 204, the gate insulating film 205, the insulating film 206, the insulating film 207, the insulating film 208, the TFT 211, and the electrode 217, at the interthce between the separation layer 222 and the base film 204. Then, the semiconductor circuit element 255 and a substrate 201 provided with an insulating film 202 and an adhesive layer 203 are attached to each other with the adhesive layer 203 (see FIG. 23B).

Next, the resin layer 251 is dissolved and removed to separate the support 252. For the resin layer 251, ainother soluble resin, plastic resin, or the like may be used, and the semiconductor circuit element 255 and the support 252 may be chemically or physically separated from each other (see FIG. 24A).

Figure 24A:
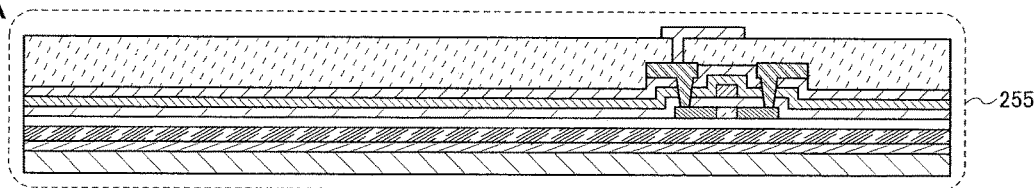
FIGS. 24A and 24B are a cross-sectional view illustrating a manufacturing process of a semiconductor circuit element and a cross-sectional view of a light-emitting device.
Figure 24B:
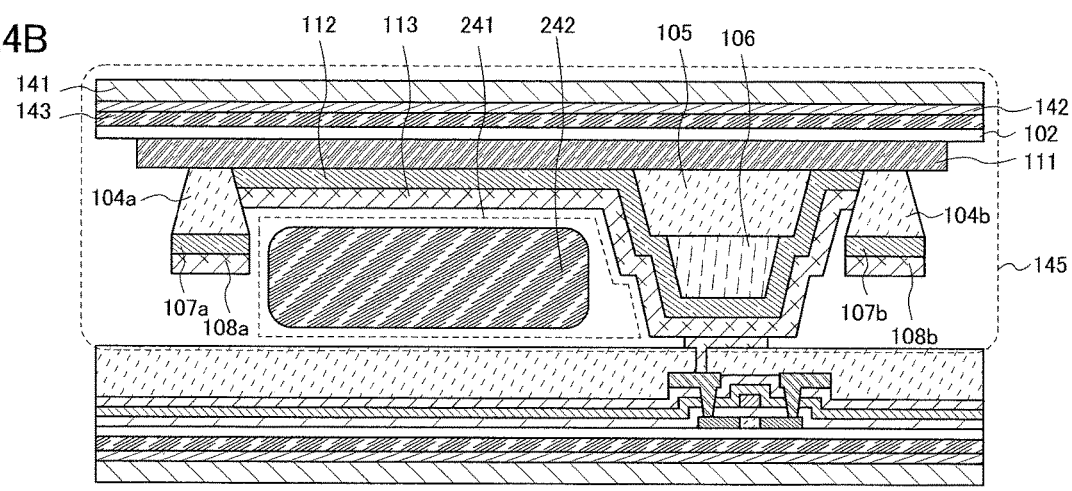

A light-emitting element 145 is manufactured based on the manufacturing steps illustrated in FIG. 1, FIGS. 2A to 2C, FIGS. 3A and 3B, FIGS. 4A and 4B, FIGS. 5A and 5B and FIGS. 6A to 6C, and the projecting portion of the electrode 113 of the light-emitting element 145 and the electrode 217 of the semiconductor circuit element 255 are directly bonded (connected) to each other (see FIG. 24B).

Before the projecting portion of the electrode 113 and the electrode 217 are directly bonded to each other surfaces of the light-emitting element 145 and the semiconductor circuit element 255 are preferably subjected to plasma treatment. In addition, when electric current is applied between the electrode 113 and the electrode 217, the bonding is strengthened.

In addition, a space 241 surrounded by the electrode 113, the partition 104a, and the structure body 305 is generated, and in the case where a desiccant 242 is provided in the space 241, the entry of moisture into the light-emitting layer 112 can be prevented.

Furthermore, because the space 241 exists, stress can be relaxed even when the substrate 141 and the substrate 201 are bent.

In a manner similar to the structure illustrated in FIG. 12, the light-emitting element 145 and the semiconductor circuit element 255 may be attached to each other with an anisotropic conductive resin film 331 containing conductive particles 332, and the projecting portion of the electrode 113 and the conductive resin 306 may be electrically connected to each other.

Alternatively, the light-emitting element 145 and the semiconductor circuit element 255 may be attached to each other with a non-conductive paste (NCP).

Through the above steps, a light-emitting device including a light-emitting element and a semiconductor circuit element is manufactured. By manufacturing the light-emitting element and the semiconductor circuit element over different substrates and then attaching the elements to each other, a semiconductor circuit is not formed below the light-emitting element and thus the generation of defective coverage due to steps can be suppressed.

In addition, because the light-emitting element and the semiconductor circuit element for driving the light-emitting element can be disposed over flexible substrates, the shape can be changed and the light-emitting element and the semiconductor circuit element for driving the light emitting element can be incorporated into electronic devices of various shapes even after the light-emitting element and the semiconductor circuit element are attached to each other.

Embodiment 2

In this embodiment, a cellular phone incorporating the light emitting device described in Embodiment 1 is described with reference to FIGS. 13A to 13D, FIGS. 22A and 22B, FIG. 25, FIG. 26, FIGS. 27A to 27D, and FIGS. 28A and 28B. In this embodiment, the same elements are denoted by the same reference numerals.

FIG. 13C is a front view of the cellular phone; FIG. 13D, a side view; FIG. 13B, a top view; and FIG. 13A, a cross-sectional view of a housing 411. The shape of the front of the housing 411 is a rectangle having longer sides and shorter sides, which may have round corners. In this embodiment, a direction parallel to the longer sides of the rectangle that is the shape of the front is referred to as a longitudinal direction, and a direction parallel to the shorter sides is referred to as a lateral direction.

In addition, the shape of the side of the housing 411 is also rectangle having longer sides and shorter sides, which may have round corners. In this embodiment, a direction parallel to the longer sides of the rectangle that is to shape of the side is a longitudinal direction, and a direction parallel to the shorter sides is referred to as a depth direction.

The cellular phone illustrated in FIGS. 13A to 13D has the housing 411, a housing 402, and a display region 413, operation buttons 404, an EL panel 421, a touch panel 423, and a support 416 which are incorporated in the housing 411.

The EL panel 421 and a driver circuit 412 which is mentioned below may be formed using the light-emitting device including the light-emitting element and the semiconductor circuit element, which is described in Embodiment 1. In the EL panel 421, the light-emitting element is used and the semiconductor circuit element is used as a pixel circuit for driving the light-emitting element. The driver circuit 412 for driving the pixel circuit may be manufactured using a semiconductor circuit element.

Figure 28A:
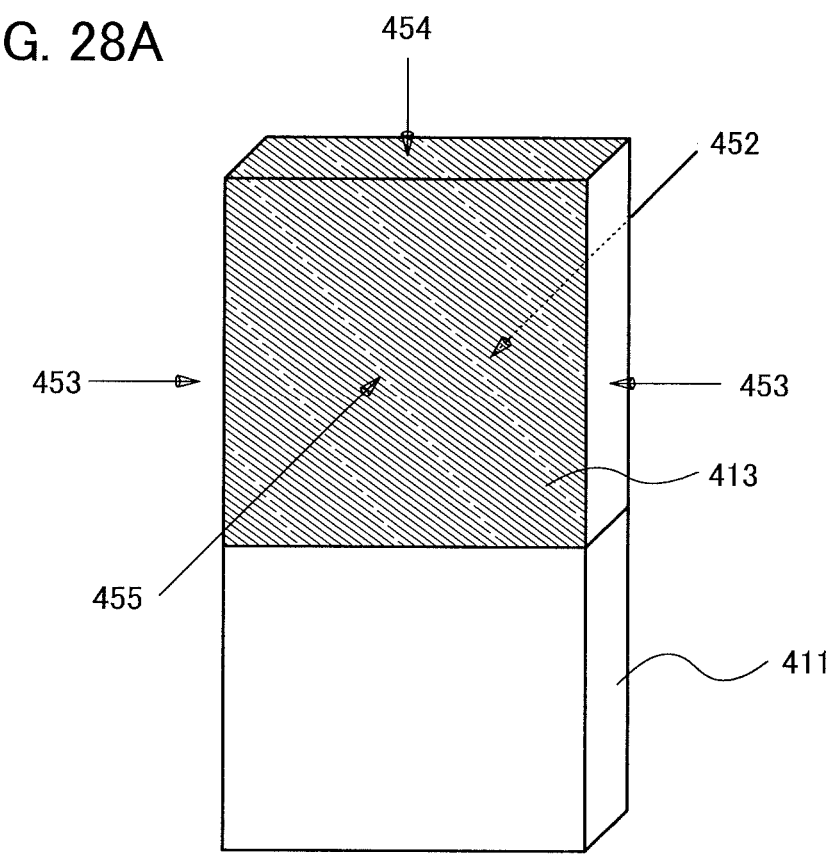
FIGS. 28A and 28B are perspective views of cellular phones.

Note that FIG. 28A is a perspective view of the housing 411. A region of the housing 411 which has the largest area is a front 455; a surface opposite to the front 455 is a back 452; regions between the front 455 and the back 452 are sides 453; and one of regions surrounded by the front 455, the back 452, and the sides 453 is a top 454.

Figure 22A:
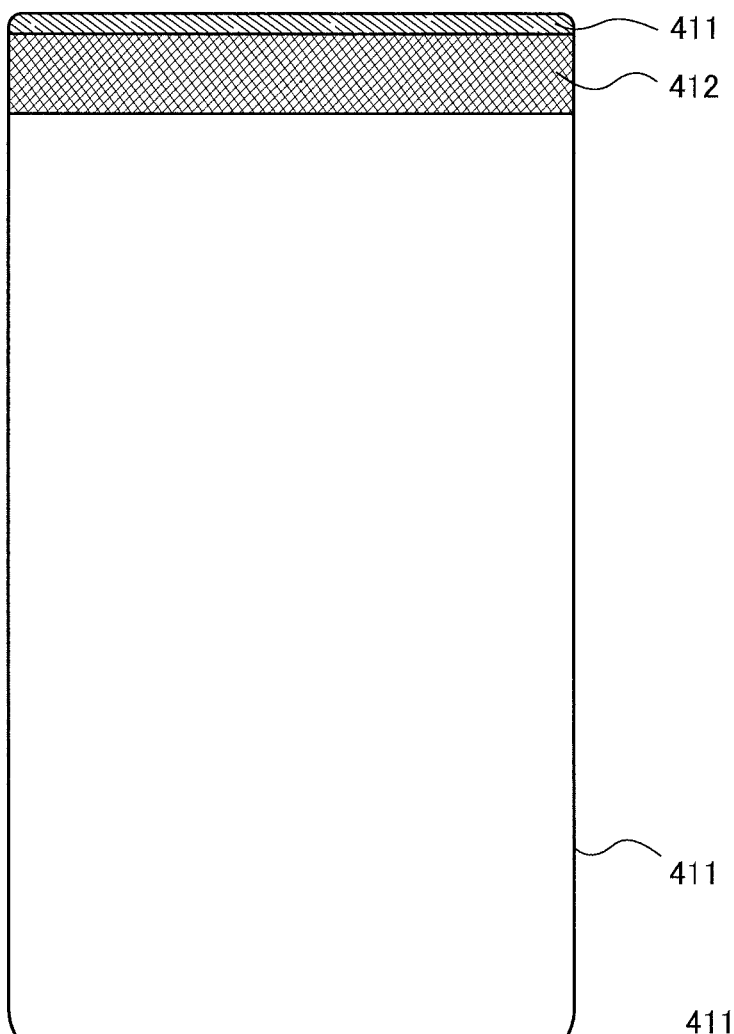
FIGS. 22A and 22B are top views of a cellular phone.

FIG. 22A is a back view of the cellular phone illustrated in FIGS. 13A to 13D.

As illustrated in FIG. 22A, the driver circuit 412 is manufactured so as to be located on the back 452 of the housing 411.

Figure 22B:
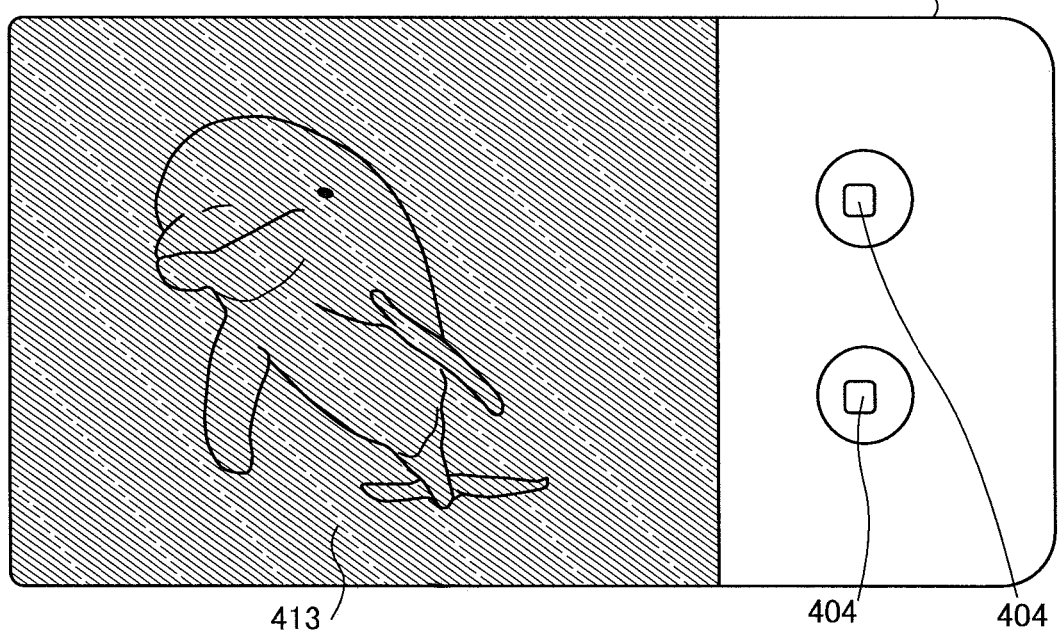

FIG. 22B is a top view of the cellular phone which is rotated 90° to the side from the orientation in FIG. 13C. Images and letters can be displayed, whether the cellular phone of this embodiment is placed horizontally or vertically for a landscape mode or a portrait mode.

As illustrated in FIG. 13A, the housing 411 includes the support 416, and the EL panel 421 is disposed on the support 416. Here, the EL panel 421 covers an upper region of the support 416.

In this manner, the display region 413 is present at an upper portion in the longitudinal direction of the cellular phone. In other words, the display region 413 is present on the top 454. Accordingly, when the cellular phone is put in, for example, a breast pocket, the display region 413 can be seen even if the cellular phone is not taken out of the pocket.

The display region 413 may be capable of displaying date, phone number, personal name, whether or not there is incoming e-mail or an incoming call, and the like. If necessary, display may be performed only in a region of the display region 413 which is on the top 454 and not performed in the other region, in which case energy saving can be achieved.

Figure 25:
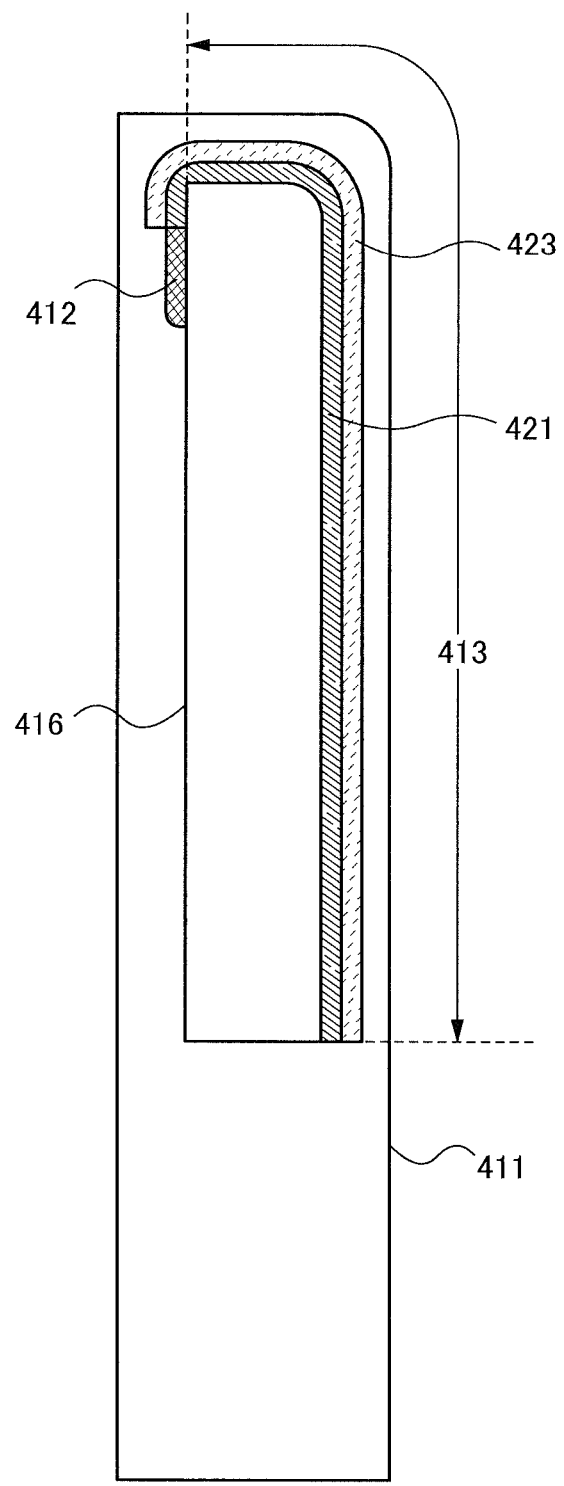
FIG. 25 is a cross-sectional view of a cellular phone.

A cross-sectional view of FIG. 13D is illustrated in FIG. 25. As illustrated in FIG. 25, in the housing 411, the EL panel 421 and the touch panel 423 are disposed along the support 416, and the display region 413 is present on the front 455 and the top 454 of the housing 411.

Figure 26:
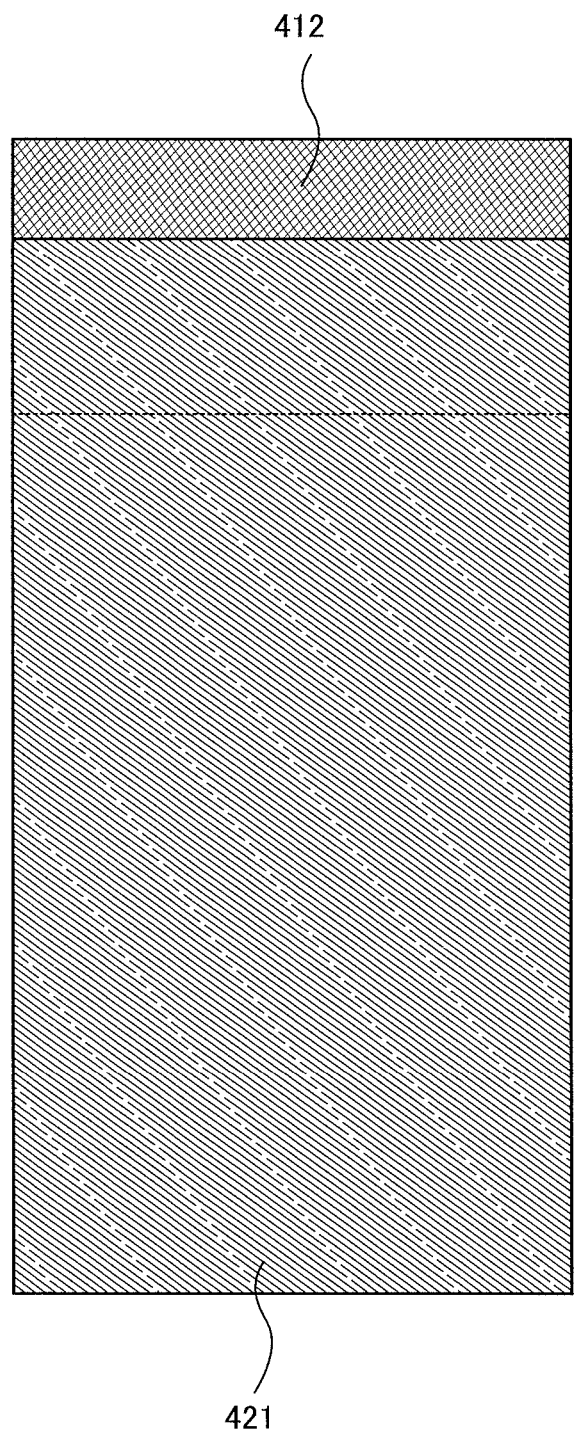
FIG. 26 is a top view of an EL panel.

A development view of the EL panel 421 and the driver circuit 412 is illustrated in FIG. 26. In FIG. 26, the EL panel 421 is manufactured so as to be located on the top 454 and the back 452, and the driver circuit 412 is located on the back 452.

In this manner, the EL panel 421 is manufactured so as to be located on both the front 455 and the top 454, not manufactured separately on the front 455 and the top 454. Thus, manufacturing cost and manufacturing time can be reduced.

The touch panel 423 is disposed on the EL panel 421, and the display region 413 displays buttons 414 for the touch panel. By touching the buttons 414 with a finger or the like, operations displayed in the display region 413 can be performed. Further, making a call or composing mail can be performed by touching the buttons 414 in the display region 413 with a finger or the like.

The buttons 414 for the touch panel 423 may be displayed when needed, and when the buttons 414 are not needed, images or letters can be displayed in the whole area of the display region 413 as illustrated in FIG. 22B Furthermore, an example of a cellular phone in which a display region 433 is present also at an upper portion in the longitudinal direction of the cellular phone and an upper longer side in a cross-section of the cellular phone also has a curvature radius is illustrated in FIGS. 27A to 27D and FIG. 28B.

Figure 27A:
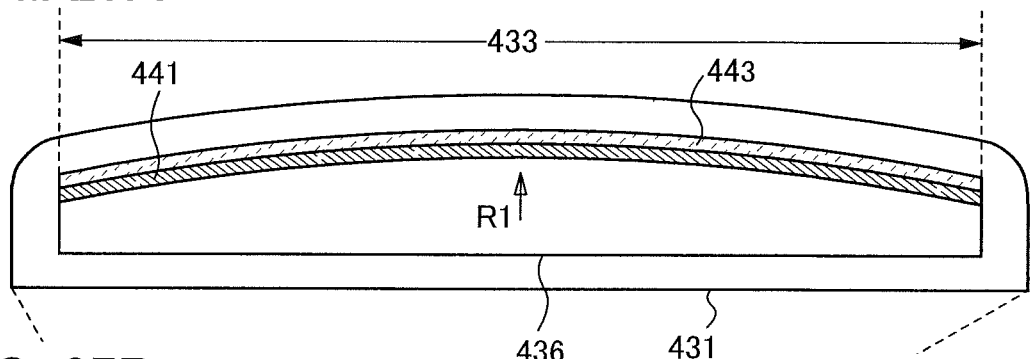
FIGS. 27A to 27D are top views and a cross-sectional view of a cellular phone.
Figure 27B:
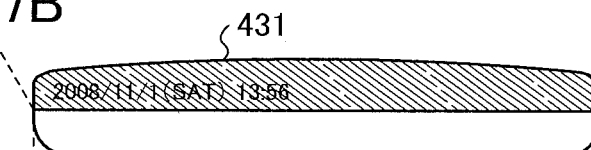
Figure 27C:
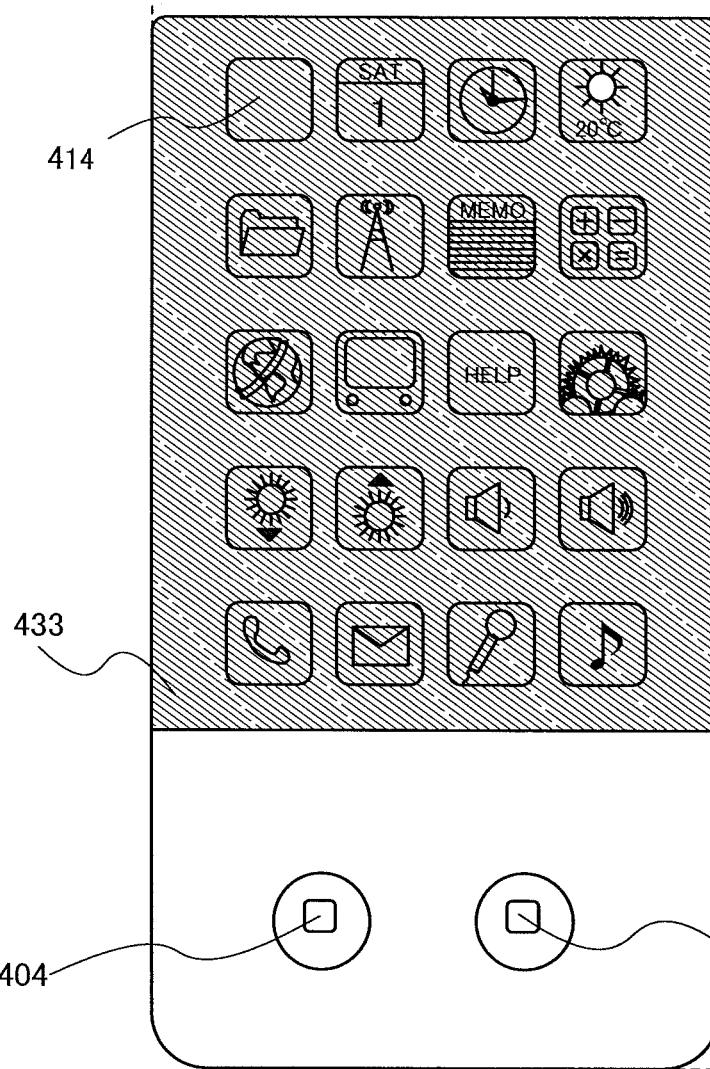
Figure 27D:
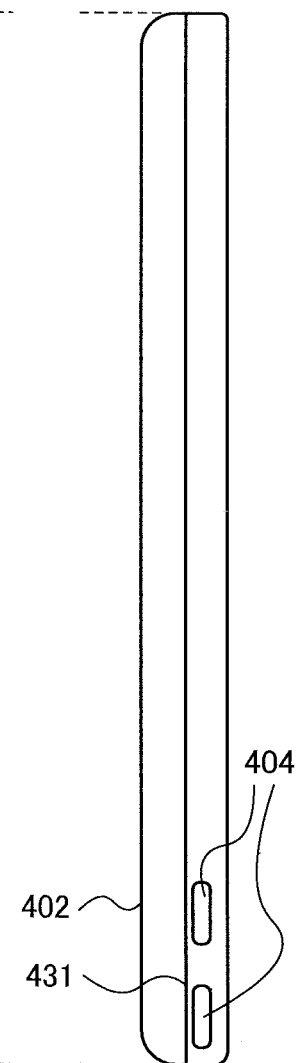

FIG. 27C is a front view of the cellular phone; FIG. 27D is a side view; FIG. 27B is a top and FIG. 27A is as cross-sectional view of a housing 431. The shape of the front of the housing 431 is a rectangle having longer sides and shorter sides, which may have round corners. In this embodiment, a direction parallel to the longer sides of the rectangle is referred to as a longitudinal direction, and as direction parallel to the shorter sides is referred to as a lateral direction.

The cellular phone illustrated in FIGS. 27A to 27D has the housing 431, a housing 402, and the display region 433, operation buttons 404, an EL panel 441, a touch panel 443, and a support 436 which are incorporated in the housing 431.

The EL panel 441 and a driver circuit 412 may be formed using the light-emitting element and the semiconductor circuit element which are described in Embodiment 1. In the EL panel 441, the light-emitting element is used and the semiconductor circuit element is used as a pixel circuit for driving the light-emitting element. The driver circuit 412 for driving the pixel circuit may be manufactured using a semiconductor circuit element.

Figure 28B:
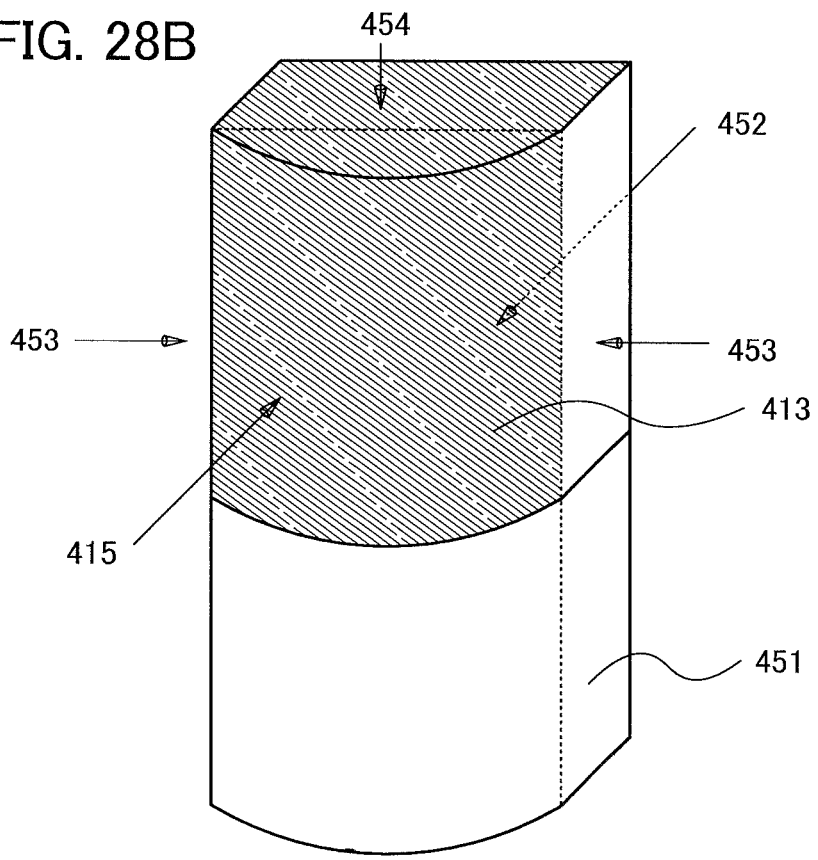

Note that FIG. 28B is a perspective view of the housing 431. In a manner similar to FIG. 28A, a region of the housing 431 which has the largest area is a front 455; a surface opposite to the front 455 is a hack 452; regions between the front 455 and the back 452 are sides 453; and one of regions surrounded by the front 455, the back 452, and the sides 453 is a top 454.

The back view of the cellular phone illustrated in FIGS. 27A to 27D is similar to FIG. 22A which is the back view of the cellular phone illustrated in FIGS. 13A to 13D.

In a manner similar to FIG. 22A, the driver circuit 412 is manufactured so as to be located on the back 452 of the housing 431. The back view of the cellular phone illustrated in FIGS. 27A to 27D corresponds to a view in which the housing 411 in FIG. 22A is replaced with the housing 431.

In the cellular phone illustrated in FIGS. 27A to 27D, the support 436 is formed to have a cross-sectional shape in which an upper longer side has a curvature radius. Accordingly, the EL panel 441 and the touch panel 443 each have a cross-sectional shape in which an upper longer side has a curvature radius. In addition, an upper longer side of the housing 431 is also curved. In other words, the display region 433 on the front 455 is curved outwards.

When the upper longer side of the support 436 has a curvature radius R1, the curvature radius R1 is preferably 20 cm to 30 cm.

Because the upper longer side of the support 436 is curved with the curvature radius R1, the upper longer sides of the EL panel 441 covering the support 436, the touch panel 443 covering the EL panel 441, and the housing 431 are also curved.

In the cellular phone illustrated in FIGS. 27A to 27D, the display region 433 is present also at an upper portion in the longitudinal direction of the cellular phone. In other words, the display region 433 is present also on the top 454. Accordingly, when the cellular phone is put in, for exiimple, a breast pocket, the display region 433 can be seen even if the cellular phone is not taken out of the pocket.

The display region 433 may be captible of displaying date, phone number, personal name, whether or not there is incoming e-mail or an incoming call, and the like. If necessary, display may be performed only in a region of the display region 433 which is on the top 454 and not performed in the other region, in which case energy saving can be achieved.

A development view of the EL panel 441 and the driver circuit 412 is similar to FIG. 26, which is the development view of those of the cellular phone illustrated FIGS. 13A to 13D, and corresponds to a view in which the EL panel 421 in FIG. 26 is replaced with the EL panel 441. In a manner similar to FIG. 26, the driver circuit 412 is located on the top 454 and the back 452.

This application is based on Japanese Patent Application serial no. 2008-294661 filed with Japan Patent Office on Nov. 18, 2008, the entire contents of which are hereby incorporated by reference.

What is claimed is:

1. A display device comprising:
    an EL panel comprising a light-emitting element over a flexible substrate;
    a driver circuit overlapping with the EL panel;
    a transistor over the flexible substrate;
    a first insulating film over the transistor; and
    an electrode of the light-emitting element over the first insulating film and electrically connected to the transistor,
    wherein the EL panel is configured to display an image in a first direction and in a second direction different from the first direction,
    wherein the EL panel is bent in such a way that an edge of the EL panel overlaps with the EL panel with a curved region of the EL panel therebetween, and
    wherein the driver circuit overlaps with the EL panel with the curved region provided therebetween.

2. The display device according to claim 1,
    wherein the EL panel comprises a flat region and the curved region extending from the flat region, and
    wherein a surface of the flat region is larger than a surface of the curved region.

3. The display device according to claim 2,
    wherein the display device is not capable of bending.

4. A display device comprising:
    an EL panel comprising a light-emitting element over a flexible substrate;
    a driver circuit overlapping with the EL panel;
    a transistor over the flexible substrate;
    a first insulating film over the transistor;
    an electrode of the light-emitting element over the first insulating film and electrically connected to the transistor; and
    a support,
    wherein the EL panel is configured to display an image in a first direction and in a second direction different from the first direction,
    wherein the EL panel is bent in such a way that an edge of the EL panel overlaps with the EL panel with a curved region of the EL panel therebetween,
    wherein the driver circuit overlaps with the EL panel, and
    wherein the support is provided between a first region of a back side of the EL panel and a second region of the back side of the EL panel.

5. A display device comprising:
    an EL panel comprising a light-emitting element over a flexible substrate;
    a driver circuit;
    a transistor over the flexible substrate;
    an electrode of the light-emitting element electrically connected to the transistor; and
    a support,
    wherein the EL panel is bent in such a way that an edge of the EL panel overlaps with the EL panel with a curved region of the EL panel therebetween,
    wherein the driver circuit overlaps with a back side of the EL panel, and
    wherein the support is provided between a first region of the back side of the EL panel and a second region of the back side of the EL panel.

* * * * *